(12) United States Patent
Funakubo et al.

(10) Patent No.: US 7,042,141 B2
(45) Date of Patent: May 9, 2006

(54) METHOD OF PRODUCING LEAD ZIRCONATE TITANATE-BASED THIN FILM, DIELECTRIC DEVICE AND DIELECTRIC THIN FILM

(75) Inventors: Hiroshi Funakubo, Kanagawa (JP); Takashi Iijima, Ibaraki (JP); Shintaro Yokoyama, Tokyo (JP); Hirofumi Matsuda, Ibaraki (JP)

(73) Assignees: The Circle for the Promotion of Science and Engineering, Tokyo (JP); National Institute of Advanced Industrial Science and Technology, Tokyo (JP); Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/777,120

(22) Filed: Feb. 13, 2004

(65) Prior Publication Data

US 2004/0207288 A1    Oct. 21, 2004

(30) Foreign Application Priority Data

Mar. 26, 2003   (JP)  ............................ 2003-086151
Aug. 29, 2003   (JP)  ............................ 2003-209766

(51) Int. Cl.
*H01L 41/187*    (2006.01)
*H02N 2/00*    (2006.01)

(52) U.S. Cl. ...................... 310/357; 310/358; 501/134; 257/347; 257/627; 252/62.9 PZ

(58) Field of Classification Search ................ 310/358; 252/62.9 R, 62.9 PZ; 257/347; 501/134
See application file for complete search history.

(56) References Cited

U.S. PATENT DOCUMENTS 5,198,269 A *   3/1993   Swartz et al. ................ 427/226
6,419,848 B1 *   7/2002   Qiu et al. ............... 252/62.9 R

FOREIGN PATENT DOCUMENTS

| EP | 513478 A2 * | 11/1992 |
|---|---|---|
| JP | 6-30154 | 12/1994 |
| JP | 01-220676 | 8/2001 |
| JP | 03-017767 | 1/2003 |

* cited by examiner

*Primary Examiner*—Darren Schuberg
*Assistant Examiner*—J. Aguirrechea
(74) *Attorney, Agent, or Firm*—Fitzpatrick, Cella, Harper & Scinto

(57) ABSTRACT

A lead zirconate titanate-based thin film is an epitaxial crystal thin film and has a chemical composition represented by the general formula $Pb_{1-x}Ln_xZr_yTi_{1-y}O_3$ (wherein Ln represents any one selected from the group consisting of lanthanum, lanthanoid elements, niobium, calcium, barium, strontium, iron, manganese and tin; and $0 \leq x < 1$, $0.43 \leq y \leq 0.65$) and whose orientation is {111} (including orientations whose tilt angle from the direction perpendicular to the substrate surface is within 15°).

30 Claims, 16 Drawing Sheets

FIG. 1
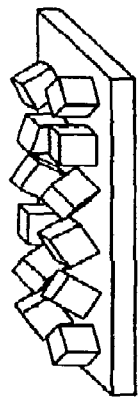
MULTI-CRYSTAL
RANDOM ORIENTATION
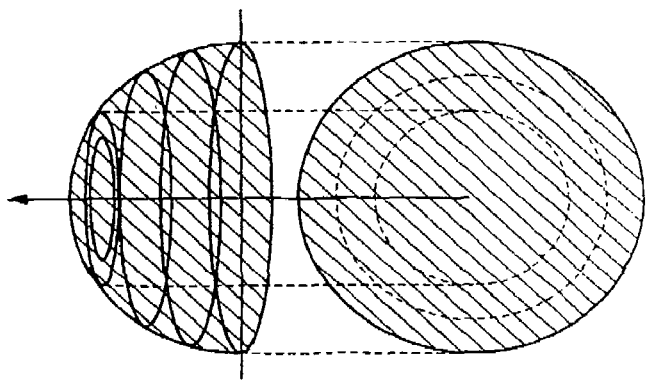
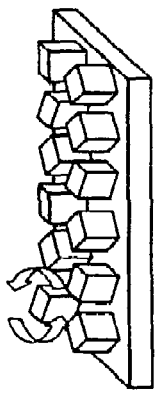
ONE-AXIS ORIENTATION
ROTATION
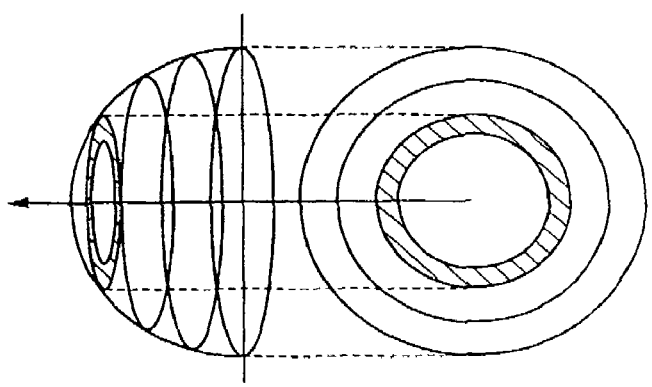
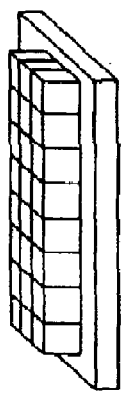
EPITAXIAL CRYSTAL
COMPLETE ORIENTATION
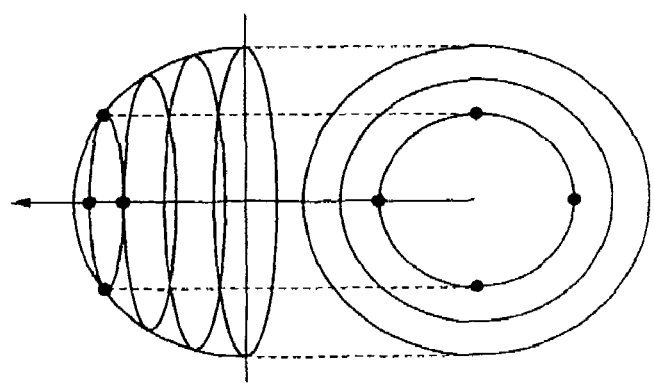

Zr/(Zr+Ti)=0.53

(a) (111)Pt//(111)YSZ//(111)Si SUBSTRATE
(b) (111)PZT//(111)Pt//(111)YSZ//(111)Si SUBSTRATE

METHOD OF PRODUCING LEAD ZIRCONATE TITANATE-BASED THIN FILM, DIELECTRIC DEVICE AND DIELECTRIC THIN FILM

BACKGROUND OF THE INVENTION

1. Field of the Invention

The present invention relates to a method of producing a lead zirconate titanate-based thin film having excellent dielectric characteristics, a dielectric device including the same and a dielectric thin film.

2. Related Background Art

Of ferroelectric materials, lead-based ferroelectric materials such as PZT and PLZT are most practically used, because of their large residual dielectric polarization. Ferroelectric materials having been practically used, such as PZT and PLZT, are materials of sintered bulk, that is, multi-crystals whose orientations have not been controlled. In sintered bulk PZT, its characteristics such as permittivity and electric-mechanical bond coefficient are known to reach a maximum at morphotoropic phase boundary (MPB) in the vicinity of $Zr/(Zr+Ti)=0.52$.

Ferroelectric thin films of, for example, PZT and PLZT have a good chance of being used in many applications, such as ferroelectric memory and actuator. As to the ferroelectric thin films which are considered most promising in terms of the technique for controlling crystal orientation, crystal orientations of (100)/(001) have been used because of ease of film-forming and film-synthesizing, and there have been performed almost no film-syntheses nor film-characteristic evaluation adopting other crystal orientations; accordingly, it has not been clarified that excellent characteristics are shown by which orientation.

There have been examined ferroelectric thin films, such as PZT and PLZT, which have been formed by sputtering and sol-gel processing (Japanese Patent Application Laid-Open No. 2003-17767, Japanese Patent Application Laid-Open No. 6-350154); however, the inventors of this invention have been examining the formation of ferroelectric films, such as PZT and PLZT, by metal organic chemical vapor deposition (MOCVD) (Japanese Patent Application Laid-Open No. 2001-220676).

In sintered bulk PZT, as to its optimal composition, the characteristics such as permittivity and electric-mechanical bond coefficient are known to reach a maximum at morphotoropic phase boundary (MPB) in the vicinity of $Zr/(Zr+Ti)=0.52$; however, there have also been reported different values of the optimal composition of morphotoropic phase boundary, for example, $Zr/(Zr+Ti)=0.80$, and moreover, the composition has not been shown yet which have the most excellent characteristics.

Accordingly, in PZT thin films, it is not clarified yet with what orientation and composition they show the most excellent characteristics.

Ferromagnetic thin films of, for example, PZT having been reported up until now are mostly one-axis orientation films, but not epitaxial crystal thin films.

SUMMARY OF THE INVENTION

In the light of the actual state of the prior arts, the inventors of this invention have searched for a combination of crystal orientation and composition which is not known, but may provide ferroelectric thin films with excellent characteristics, while producing excellent epitaxial crystal thin films of PZT and PLZT and evaluating the orientation and composition dependency thereof. Accordingly, the object of this invention is to provide epitaxial crystal thin films formed based on PZT and PZLT both having a special combination of crystal orientation and composition that provides excellent characteristics to the thin films, the application of such thin films, and a method of producing the same.

To accomplish the above object, the inventors have successfully produced excellent epitaxial crystal thin films of PZT and PLZT by MOCVD. And they have found, after the evaluation of the orientation and composition dependency of the thin films, that there exists a special combination of crystal orientation and composition that gives feroelectric thin films excellent characteristics beyond expectation. Consequently, the present invention provides:

(1) a lead zirconate titanate-based thin film, characterized in that it is an epitaxial crystal thin film which has a chemical composition represented by the general formula $Pb_{1-x}Ln_xZr_yTi_{1-y}O_3$ (wherein Ln represents any one selected from the group consisting of lanthanoid elements including lanthanum, niobium, calcium, barium, strontium, iron, manganese and tin; and $0 \leq x < 1$, $0.43 \leq y \leq 0.65$) and whose orientation is {111} (including orientations whose tilt angle from the direction perpendicular to the substrate surface is within 15°);

(2) the lead zirconate titanate-based thin film according to the above description (1), wherein the orientation of the film is (111) (including orientations whose tilt angle from the direction perpendicular to the substrate surface is within 15°);

(3) the lead zirconate titanate-based thin film according to the above description (1), wherein the half-width of the locking curve in the circumferential direction of X-ray pole figure is within 30°;

(4) the lead zirconate titanate-based thin film according to the above description (1), wherein the half-width of the locking curve in the circumferential direction of X-ray pole figure is within 15°;

(5) the lead zirconate titanate-based thin film according to the above description (1), wherein the half-width of the locking curve of the crystal is within 15°;

(6) the lead zirconate titanate-based thin film according to the above description (1), wherein the half-width of the locking curve of the crystal is within 5°;

(7) the lead zirconate titanate-based thin film according to the above description (1), wherein the half-width of the locking curve of the crystal is within 2°;

(8) the lead zirconate titanate-based thin film according to the above description (1), wherein the half-width of the locking curve of the crystal is within 1°;

(9) a lead zirconate titanate-based thin film having a composition represented by the general formula $Pb_{1-x}Ln_xZr_yTi_{1-y}O_3$ (wherein Ln represents any one selected from the group consisting of lanthanum, lanthanoid elements, niobium, calcium, barium, strontium, iron, manganese and tin; $0 \leq x < 1$; and $0.43 \leq y < 0.57$), characterized in that its relative permittivity—voltage characteristics satisfy the following equation: $\Delta\epsilon/\Delta E \geq 3.0$, wherein $\Delta\epsilon$ is a change in relative permittivity and $\Delta E$ is a change in electric field strength (kv/cm);

(10) the lead zirconate titanate-based thin film according to the above description (9), wherein its relative permittivity—voltage characteristics satisfy the following equation: $\Delta\epsilon/\Delta E \geq 5.0$;

(11) the lead zirconate titanate-based thin film according to the above description (9), wherein the film is an epitaxial film whose orientation is (111) or within 15° from (111);

(12) the lead zirconate titanate-based thin film according to the above description (1) or (11), wherein the {111} face of the epitaxial film is orientated within a tilt angle of 5° (including 0°);

(13) the lead zirconate titanate-based thin film according to the above description (1) or (12), wherein the {111} face of the epitaxial film is orientated within a tilt angle of 3° (including 0°);

(14) the lead zirconate titanate-based thin film according to the above description (1) or (9), wherein silicon is used for the substrate;

(15) the lead zirconate titanate-based thin film according to the above description (14), wherein the silicon is (100) orientated;

(16) the lead zirconate titanate-based thin film according to the above description (14), wherein the silicon is (111) orientated;

(17) the lead zirconate titanate-based thin film according to the above description (1) or (9), wherein the film is formed by MOCVD;

(18) the lead zirconate titanate-based thin film according to the above description (1), wherein in the general formula $Pb_{1-x}Ln_xZr_yTi_{1-y}O_3$, $0.43 \leq y \leq 0.57$;

(19) the lead zirconate titanate-based thin film according to the above description (18), wherein in the general formula $Pb_{1-x}Ln_xZr_yTi_{1-y}O_3$, $0.45 \leq y \leq 0.55$;

(20) the lead zirconate titanate-based thin film according to the above description (1) or (9), wherein the crystal structure is at least any one of tetragonal, cubic and rhombohedral crystals;

(21) the lead zirconate titanate-based thin film according to the above description (20), wherein at least any two of tetragonal, cubic and rhombohedral crystals coexist;

(22) the lead zirconate titanate-based thin film according to the above description (1) or (9), wherein at least the surface of the substrate is electrically conductive;

(23) a lead zirconate titanate-based thin film, characterized in that it is an epitaxial crystal thin film which has a chemical composition represented by the general formula $Pb_{1-x}Ln_xZr_{1-y}Ti_yO_3$ (wherein Ln represents any one selected from the group consisting of lanthanum, lanthanoid elements, niobium, calcium, barium, strontium, iron, manganese and tin; and $0 \leq x < 1$, $0.40 \leq y \leq 0.65$), whose orientation is {111} (including orientations whose tilt angle from the direction perpendicular to the substrate surface is within 15°), and in which at least any two of tetragonal, cubic and rhombohedral crystals coexist;

(24) the lead zirconate titanate-based thin film according to the above description (23), wherein in the general formula $Pb_{1-x}Ln_xZr_{1-y}Ti_yO_3$, $0.43 \leq y \leq 0.57$;

(25) a lead zirconate titanate-based epitaxial thin film formed by MOCVD, characterized in that it has a chemical composition represented by the general formula $Pb_{1-x}Ln_xZr_{1-y}Ti_yO_3$ (wherein Ln represents any one selected from the group consisting of lanthanum, lanthanoid elements, niobium, calcium, barium, strontium, iron, manganese and tin; and $0 \leq x < 1$, $0.43 \leq y \leq 0.65$) and its orientation is {111} (including orientations whose tilt angle from the direction perpendicular to the substrate surface is within 15°);

(26) a dielectric device, including the lead zirconate titanate-based thin film according to any one of the above descriptions (1), (9), (23) and (25);

(27) a piezoelectric device, including the lead zirconate titanate-based thin film according to any one of the above descriptions (1), (9), (23) and (25);

(28) an ink jet printer head, including the piezoelectric device according to the above description (27);

(29) a ferroelectric device, including the lead zirconate titanate-based thin film according to any one of the above descriptions (1), (9), (23) and (25);

(30) a pyroelectric device, including the lead zirconate titanate-based thin film according to any one of the above descriptions (1), (9), (23) and (25);

(31) a method of producing a lead zirconate titanate-based thin film, characterized in that a crystal film having a chemical composition represented by the general formula $Pb_{1-x}Ln_xZr_{1-y}Ti_yO_3$ (wherein Ln represents any one selected from the group consisting of lanthanum, lanthanoid elements, niobium, calcium, barium, strontium, iron, manganese and tin; and $0 \leq x < 1$, $0.43 \leq y \leq 50.65$) is epitaxially grown on a substrate at least the surface of which has a {111} orientation or orientation with a tilt angle within 15° from {111} by MOCVD;

(32) the method of producing a lead zirconate titanate-based thin film according to the above description (31), wherein $0.43 \leq y \leq 0.57$;

(33) the method of producing a lead zirconate titanate-based thin film according to the above description (31), wherein $0.45 \leq y \leq 0.55$; and

(34) a lead zirconate titanate-based thin film, characterized in that it is a crystal thin film which has a chemical composition represented by the general formula $Pb_{1-x}Ln_xZr_{1-y}Ti_yO_3$ (wherein Ln represents any one selected from the group consisting of lanthanum, lanthanoid elements, niobium, calcium, barium, strontium, iron, manganese and tin; and $0 \leq x < 1$, $0.40 \leq y \leq 0.65$), whose orientation is {111} (including orientations whose tilt angle from the direction perpendicular to the substrate surface is within 15°), and in which at least any two of tetragonal, cubic and rhombohedral crystals coexist.

BRIEF DESCRIPTION OF THE DRAWINGS

FIG. 1 is a schematic view showing an epitaxial crystal, a one-axis crystal and a multi-crystal and a schematic view of pole figure patterns of X-ray diffraction;

DESCRIPTION OF THE PREFERRED EMBODIMENTS

This invention has been made based on the inventors' finding that a lead zirconate titanate-based epitaxial thin film having the most excellent dielectric characteristics is obtained by forming a lead zirconate titanate-based thin film represented by the general formula $Pb_{1-x}Ln_xZr_{1-y}Ti_yO_3$ (wherein Ln represents any one selected from the group consisting of lanthanum, lanthanoid elements, niobium, calcium, barium, strontium, iron, manganese and tin; and $0 \leq x < 1$) so that it has a specific composition ($0.43 \leq y \leq 0.65$) and a specific crystal orientation [{111} orientation or any one of orientations whose tilt angle from the direction perpendicular to the substrate surface is within 15°].

Typical examples of lead zirconate titanate-based dielectrics, such as PZT and PLZT, which are represented by the general formula $Pb_{1-x}Ln_xZr_{1-y}Ti_yO_3$ (wherein Ln represents any one selected from the group consisting of lanthanum, lanthanoid elements, niobium, calcium, barium, strontium, iron, manganese and tin; and $0 \leq x < 1$, $0 < y < 1$) are: $Pb(Zr,Ti)O_3$ [PZT] and $(Pb,La)(Zr,Ti)O_3$ [PLZT]. PZT and PLZT are preferable lead zirconate titanate-based dielectrics. And it is known that if part of Pb of the PZT is replaced with La, the performance of the dielectric is improved and that if the same is replaced with Nb etc., the similar performance is also obtained. When part of Pb is replaced with La, the amount of La used for the replacement is preferably $0 \leq x \leq 0.15$, more preferably $0.04 \leq x \leq 0.12$. The same is true for the other elements.

The inventors successfully made possible the epitaxial growth of lead zirconate titanate-based crystals especially by MOCVD, and a closer investigation was made while changing the composition and orientation of the lead zirconate titanate-based crystals.

Figure 6:
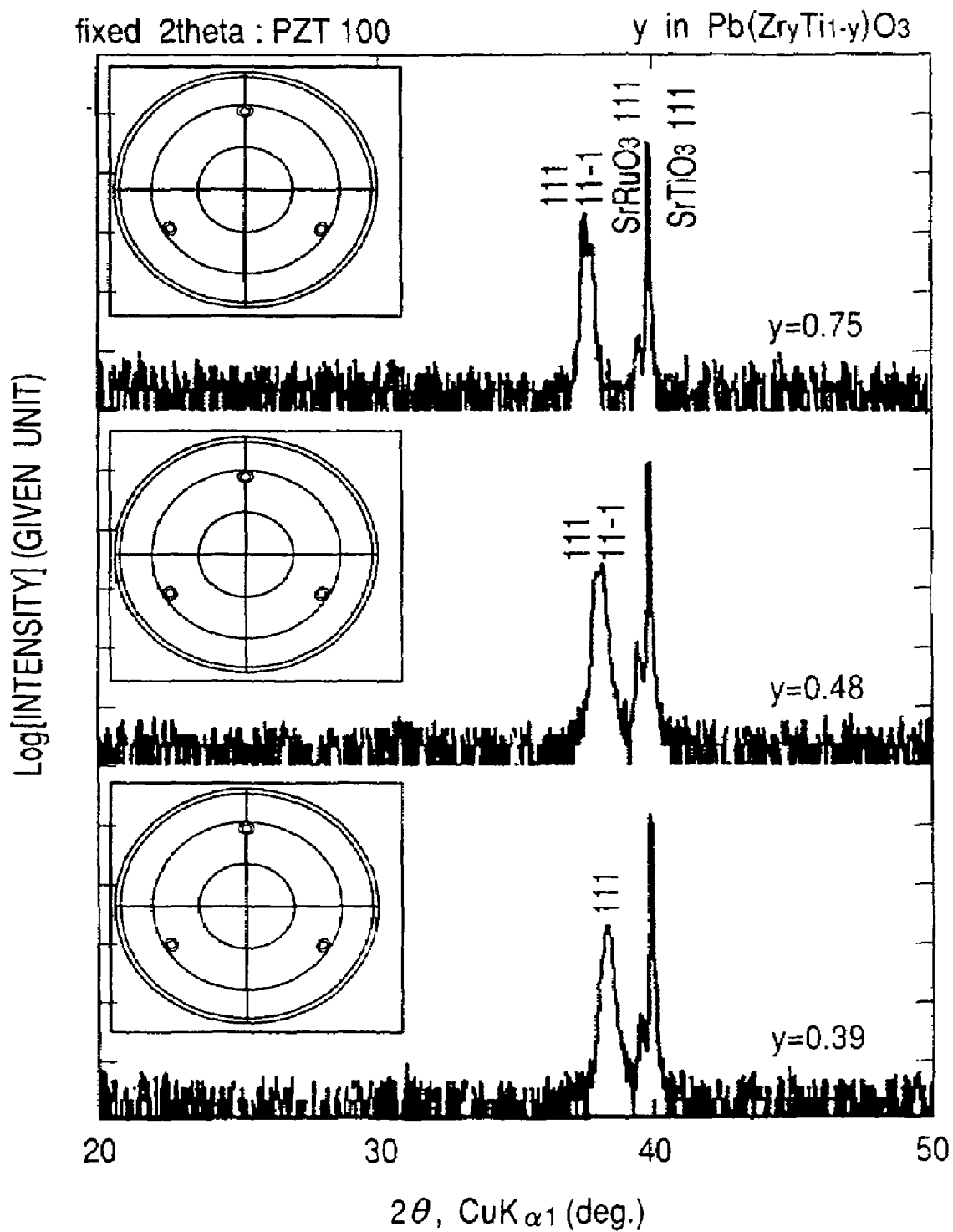
FIG. 6 is a view showing the XRD patterns of the PZT films formed on a (111)SrRuO$_3$//(111)SrTiO$_3$ substrate and having composition ratios of y=0.75 (rhombohedral crystal), y=0.48 (morphotoropic phase boundary) and y=0.39 (tetragonal crystal), respectively.

Whether the formed film is an epitaxial crystal (single crystal:complete orientation) or a one-axis orientation crystal or a multi-crystal (random orientation) can be distinguished by the pattern of the pole figure of X-ray diffraction, as shown in FIG. 1. An epitaxial crystal is a crystal in which crystal grains are oriented completely in the same direction in all the crystalline regions, and spots of n-time symmetry appear in the pole figure as shown in the left of FIG. 1 (FIG. 1 shows that spots of 4-time symmetry appear when observing the 110 face of an epitaxial crystal having 100 orientation and for an epitaxial crystal having 111 orientation, FIG. 6 shows that spots of 3-time symmetry appear). In this case, the half-width of the spots in the circumferential direction is preferably within 30°, more preferably within 15° and particularly preferably within 10°. A one-axis orientation crystal is a crystal in which crystal grains are oriented in the same direction relative to one axis in each crystalline region, but are rotated mutually in a plane. A ring-shaped diffraction pattern appears in the pole figure as shown in the middle of FIG. 1. A multi-crystal is a crystal in which crystal grains are orientated at random in each crystal region, and a diffraction pattern of the whole circle appears in the pole figure, as shown in the right of FIG. 1.

A method of forming a lead zirconate titanate-based film itself, which uses MOCVD, is disclosed in Japanese Patent Application Laid-Open No. 2001-220676 (Japanese Patent Application No. 2000-32817) by the inventors of this invention, and it will be briefly described later.

The lead zirconate titanate-based thin film of this invention is a lead zirconate titanate-based thin film of PZT and PLZT represented by the general formula $Pb_{1-x}Ln_xZr_{1-y}Ti_yO_3$ (wherein Ln represents any one selected from the group consisting of lanthanum, lanthanoid elements, niobium, calcium, barium, strontium, iron, manganese and tin; and $0 \leq x < 1$), characterized in that it has a composition in which y falls in the rage of $0.43 \leq y \leq 0.65$, preferably in the rage of $0.43 \leq y \leq 0.60$, more preferably in the rage of $0.43 \leq y \leq 0.57$ and much more preferably in the rage of $0.45 \leq y \leq 0.55$ and it is an epitaxial film having a {111} orientation or any one of orientations whose tilt angle from the direction perpendicular to the substrate surface is within 15°.

Closer examination by the inventors have shown that selectively outstanding dielectric characteristics (P-E characteristic, P-S characteristic), which are different from those of an extension of the characteristics of the films of tetragonal crystal alone or rhombohedral crystal alone, are observed in the lead zirconate titanate-based thin film having a composition such that y=around 0.52, which may be a morphotoropic phase boundary, in particular y falls in the range of $0.45 \leq y \leq 0.65$ and having an orientation {111}. The composition is preferably such that y is in the range of $0.43 \leq y \leq 0.60$, more preferably in the rage of $0.43 \leq y \leq 0.57$, and particularly preferably in the rage of $0.45 \leq y \leq 0.55$. With y beyond 0.65, the effect of improving the dielectric characteristics is small. With y equal to or more than 0.40, the effect of improving the electrostriction characteristics is detected; however, with y less than 0.43, undesirably the characteristics such as residual dielectric polarization value Pr and relative permittivity $\epsilon$ tend to deteriorate.

Further, examination by the inventors has also showed that there exists a film of the PZT having a composition in the above described range where at least any two of tetragonal, cubic and rhombohedral crystals coexist. It has not been known up until now that there coexists any two or three of tetragonal, cubic and rhombohedral crystals in the PZT system. In this invention tetragonal crystal and cubic and/or rhombohedral crystal may coexist, and besides, cubic and rhombohedral crystals may also coexist.

Figure 2A:
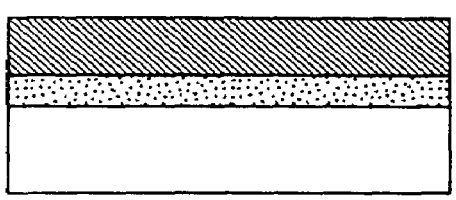
FIGS. 2A, 2B, 2C, 2D and 2E are schematic views showing the coexisting state of different crystal structures in the epitaxial films of this invention under no influence of an electric field.
Figure 2B:
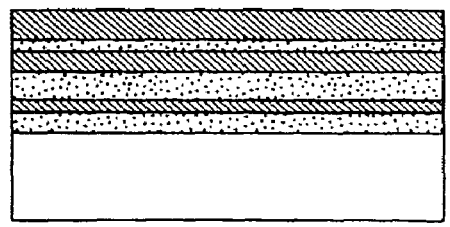
Figure 2C:
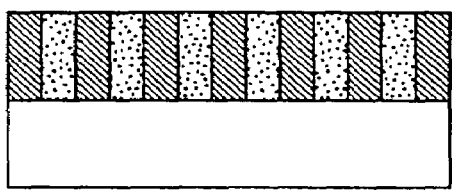
Figure 2D:
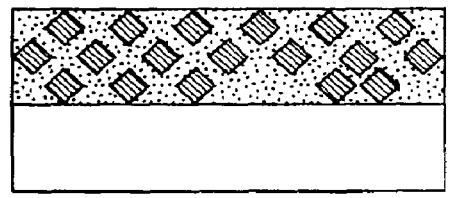
Figure 2E:
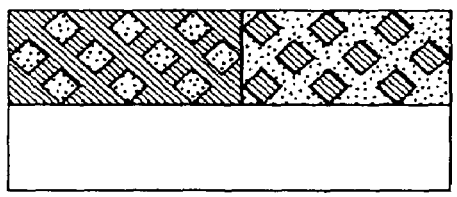

The coexisting state of these different crystal structures may be as shown in FIGS. 2A to 2E under no influence of an electric field. FIG. 2A shows a two-layer structure in which two or more different crystals (tetragonal, cubic and rhombohedral crystals) are stacked in the film thickness direction. FIG. 2B shows a multilayer structure in which two or more different crystals are stacked into multiple layers. In the above figures, the thickness if each layer is shown uniformly; however, the thickness may be nonuniform and a portion of discontinuity may exist in part of the layers. FIG. 2C shows a state in which two or more different crystals coexist side by side in the direction other than that parallel to the substrate surface. FIG. 2D shows a state in which the regions of two or more crystals are dispersed and intermingled not in a maldistributed manner, but in an almost uniform manner. FIG. 2E shows a state in which the regions of two or more crystals are dispersed and intermingled not in a maldistributed manner in the film thickness direction, but in a maldistributed manner in the film surface direction. It is to be understood that the films in accordance with this invention act as a mixed crystal of two or more crystal phases as a whole and exert ferroelectric characteristics which are different from an extension of the characteristics of each crystal phase, and therefore, the structures of FIGS. 2A to 2C are different from macroscopic stacking structures having the characteristics of the respective crystal phases as they are (the simply totalized characteristics) or from structures in which macroscopic regions are intermingled. Of the structures shown in FIGS. 2A to 2E, those of FIGS. 2C to 2E are preferable.

The films of this invention have a $\{111\}$ orientation. Most preferably they have a (111) orientation. In the following this invention will sometimes be described in terms of the films having a (111) orientation; however, it is to be understood that-such description also applies for the other films having a $\{111\}$ orientation. Further, the films having orientations whose tilt angle from the direction perpendicular to the substrate surface is within 15° are also included in the films of this invention, because they can have the same characteristics as the films having a $\{111\}$ orientation. In the films of this invention, though the tilt angle is within 15°, the smaller tile angle, the better. Therefore, the tilt angle is preferably 5° or less, more preferably 3° or less, and the films having a complete $\{111\}$ orientation are the most preferable. Preferably the crystals having a $\{111\}$ orientation and orientations whose tilt angle is within 15° account for at least 70% of the total amount of crystals, preferably 80% or more, much more preferably 90% or more, and particularly preferably 100%.

The completeness of the crystal orientation of a film can be evaluated by the half-value width of a locking curve. Preferably the half-value width of a locking curve is 15° or less, more preferably 5° or less, much more preferably 2° or less, and particularly preferably 1° or less. That the completeness of epitaxial orientation of a film can be evaluated by the half-value width in the film's X-ray pole figure has been already described above. For example, the half-value width at $2\theta=38.3°$ for PZT is preferably 15° or less, more preferably 5° or less, still more preferably 2° or less, and most preferably 1° or less.

The second aspect of this invention is a lead zirconate titanate-based thin film having a composition represented by the general formula $Pb_{1-x}Ln_xZr_yTi_{1-y}O_3$ (wherein Ln represents any one selected from the group consisting of lanthanum, lanthanoid elements, niobium, calcium, barium, strontium, iron, manganese and tin; $0 \leq x < 1$; and $0.43 \leq y \leq 0.55$), characterized in that its relative permittivity—voltage characteristics (C-E characteristics) satisfy the following equation: $\Delta\epsilon/\Delta E \geq 3.0$, wherein $\Delta\epsilon$ is a change in relative permittivity and $\Delta E$ is a change in electric field strength (kv/cm). In the above lead zirconate titanate-based thin film, preferably $\Delta\epsilon/\Delta E \geq 5$, and more preferably the film is an epitaxial film having a crystal structure of a (111) orientation or any one of orientations whose tilt angle from the direction perpendicular to the substrate surface is within 15°.

Figure 11:
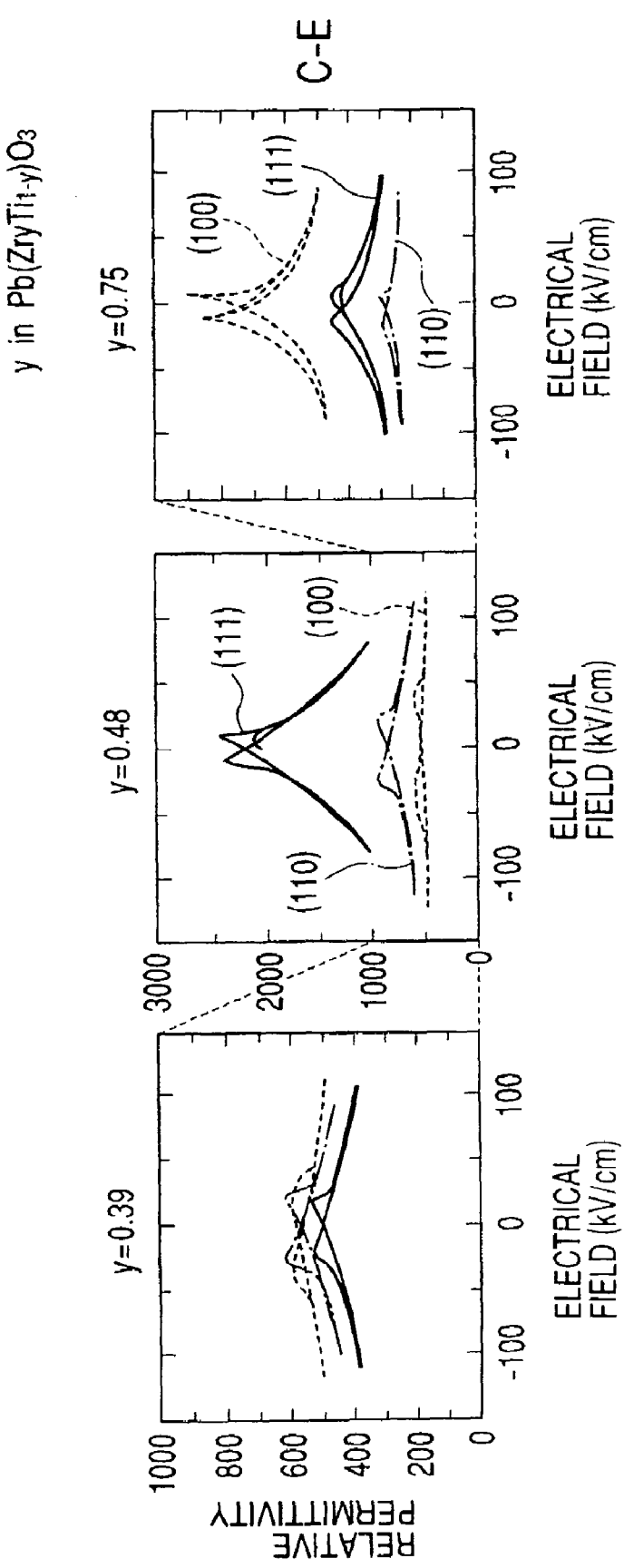
FIG. 11 illustrates the composition and crystal orientation dependency of the relative permittivity-voltage characteristics (C-E characteristics) of PZT films.

The C-E characteristics are characteristics shown in FIG. 11. The relative permittivity changes with the electric field strength as shown in the same figure. $\Delta\epsilon$ is the difference between the maximum and the minimum of the relative permittivity and $\Delta E$ is the difference in electric field strength which creates the difference between the maximum and the minimum of the relative permittivity. The $\Delta\epsilon/\Delta E$ is calculated using the following equation: $\Delta\epsilon=\epsilon1-\epsilon2$, wherein $\epsilon1$ is the maximum relative permittivity measured in the coercive electric field Ec (kv/cm) and $\epsilon2$ is the minimum relative permittivity measured at a electric field strength of $-2Ec$. $\Delta E$ is the difference between the coercive electric field Ec, which allows the relative permittivity to be the maximum, and $-2Ec$, and therefore, the absolute value of $\Delta E$ is 3Ec.

When the C-E characteristics have a good symmetry as shown in FIG. 11, any one of the maximum relative permittivity values in the positive electric field and in the negative electric field can be selected for the value $\epsilon1$. However, when the C-E characteristics do not have a symmetry and the maximum relative permittivity values are different in the positive electric field and in the negative electric field, the larger value is employed. For the films having C-E characteristics whose curves do) not have an intersection in an electric field of 0, the $\Delta\epsilon/\Delta E$ is calculated by determining the value $\Delta E$ while letting the electric field strength at which the curves have an intersection be 0. In the conventionally used PZT thin films, such as (100) film-having the above composition where $y=0.48$, the change in relative permittivity is small and the value $\Delta\epsilon/\Delta E$ is 2.5 at best. The inventors of this invention have found that a lead zirconate titanate-based thin film develops especially good piezoelectric characteristics when the value $\Delta\epsilon/\Delta E \geq 3.0$ or more.

The third aspect of this invention is a lead zirconate titanate-based thin film having a composition represented by the general formula $Pb_{1-x}Ln_xZr_{1-y}Ti_yO_3$ (wherein Ln represents any one selected from the group consisting of lanthanum, lanthanoid elements, niobium, calcium, barium, strontium, iron, manganese and tin; $0 \leq x < 1$; and $0.40 \leq y \leq 0.65$), characterized in that it is an epitaxial film which has a $\{111\}$ orientation or any one of orientations whose tilt angle from the direction perpendicular to the substrate surface is within 15° and in which tetragonal, cubic and rhombohedral crystals coexist. In this invention, the inventors have found a crystal film which has a $\{111\}$ orientation and in which tetragonal, cubic and rhombohedral crystals coexist in the vicinity of the morphotoropic phase boundary. The high dielectric characteristics of the film described in connection with the first aspect of this invention may be attributed to the coexistence of at least two of tetragonal, cubic and rhombohedral crystals.

The fourth aspect of this invention is a lead zirconate titanate-based thin film formed by MOCVD, characterized in that it is an epitaxial film which has a composition represented by the general formula $Pb_{1-x}Ln_xZr_{1-y}Ti_yO_3$ (wherein Ln represents any one selected from the group consisting of lanthanum, lanthanoid elements, niobium, calcium, barium, strontium, iron, manganese and tin; $0 \leq x < 1$; and $0.40 \leq y \leq 0.65$) and has a $\{111\}$ orientation or any one of orientations whose tilt angle from the direction perpendicular to the substrate surface is within 15°. The use of MOCVD enables the formation of an excellent epitaxial film.

The method of producing a lead zirconate titanate-based thin film which uses MOCVD will be described below. In this invention, preferably a lead zirconate titanate-based thin film is formed by MOCVD; however, other methods such as sputtering and sol-gel process can also be employed as long as they allow the formation of a lead zirconate titanate-based thin film as specified in the first to third aspects of this invention.

In MOCVD, starting materials for forming a film of a lead zirconate titanate-based material as described above are not limited to any specific ones, and starting materials well known as those used for forming a lead zirconate titanate-based material by MOCVD can be used as they are. In other words, they can be vaporizable organometallic compounds that contain metals for forming a lead zirconate titanate-based material. In general, alkyl metallic compounds, alkoxy metallic compounds, alkyl alkoxy metallic compounds, β-diketone compounds, cyclopentadienyl compounds and halogenides are used.

In PZT, if $((CH_3)_3CCO)_2CH-$ is represented by thd, examples of Pb materials include: $Pb(C_2H_5)_4$, $Pb(thd)_2$, $(C_2H_5)_3PbOCH_2C(CH_3)_3$, $Pb(C2H_5)_3$ $(t-OC_4H_9)$, $Pb(C_{11}H_{19}O_2)$, $Pb(CH_3)_4$, $PbCl_4$, $Pb(n-C_3H_7)_4$, $Pb(i-C_3H_7)_4$, $Pb(C_6H_5)_4$ and $PbCl_2$, examples of Zr materials include: $Zr(t-OC_4H_9)_4$, $Zr(i-C_3H_7)_4$, $Zr(thd)_4$, $ZrCl_4$, $Zr(C_5H_5)_2Cl_2$, $Zr(OCH_3)_4$, $Zr(OC_2H_5)_4$, $Zr(n-OC_5H_{11})_4$ and $Zr(C_2H_6O_2)_4$, and examples of Ti materials include: $Ti(i-OC_3H_7)_4$, $Ti(thd)_2$ $(i-OC_3H_7)_2$, $Ti(OC_2H_5)_4$, $TiCl_4$, $Ti(OCH_3)_4$, $Ti(OCH_9)_4$ and $Ti(OC_5H_{11})_4$. In PZT, part of its Pb is sometimes replaced with La; in such a case, $La(thd)_3$, $La(C_2H_6O_2)_4$ and $LaCl_3$ can be used as La materials. Many of these materials have the problems of not only being toxic, but being in the solid or liquid state at room temperature and having low vapor pressure, therefore, their vapor pressure need to be increased by heating.

In the method of this invention, MOCVD can be carried out under the same conditions (reactor, materials, material composition, substrate, substrate temperature, etc.) as those commonly employed in MOCVD. Material gases can be supplied intermittently. In the following the method of forming a film of this invention will be described in more detail, though the description is not intended to limit this invention.

To introduce a mixed gas, as a material, uniformly into a reactor, it is preferable to mix material gases prior to the introduction into the reactor. To prevent oxidation reaction, which inhibits the formation of the single crystal film, from progressing in piping, it is preferable to control the temperature of the piping. In PZT system, the heating temperature is preferably 30° C. to 250° C., more preferably 35° C. to 200° C., and much more preferably 35° C. to 150° C., though it depends on the type of materials. If the temperature is too high, decomposed matter of oxides, carbides or the like is deposited in the piping, which might make the stable film formation difficult.

The substrate temperature is preferably 450° C. to 800° C., more preferably 500° C. to 750° C., and much more preferably 550° C. to 720° C. Although the film formation can be carried out without rotating the substrate, if it is carried out while rotating the substrate, the rotational speed is preferably 0.01 rpm to 100 rpm, more preferably 0.1 rpm to 50 rpm, and much more preferably 0.1 rpm to 15 rpm.

As a carrier gas, an inert gas is selected, and preferable carrier gases include, for example, Ar, $N_2$, and He. The mixed system thereof can also be used as a carrier gas. The flow rate of these carrier gases is preferably 10 cm³/min to 1000 cm³/min, more preferably 20 cm³/min to 750 cm³/min, and much more preferably 50 cm³/min to 500 cm³/min.

The bubbling time of liquid materials before the formation of a film is preferably 5 min to 2 hrs and more preferably 10 min to 1 hrs, though it depends on the structure of the apparatus used. Starting the film formation without setting such bubbling time might result in inferior composition control of the film formed at the beginning.

As a purge gas, the same type of gas as the carrier gas is selected. The flow rate of the purge gas is preferably 10 cm³/min to 20000 cm³/min, more preferably 50 cm³/min to 10000 cm³/min, though it depends on the purge time. If the flow rate is too low, the film formation might take too long a time, resulting in decrease in film forming rate, whereas if the flow rate is too high, the substrate temperature might decrease, causing adverse effect on the film quality.

As an oxidizing gas, oxygen gas or oxygen-nitrogen mixed g as is used. The flow rate of the oxidizing gas is preferably 10 cm³/min to 5000 cm³/min, more preferably 20 cm³/min to 2000 cm³/min, and much more preferably 30 cm³/min to 1000 cm³/min. Because of the flow rate control of each of the above described gases, the total pressure of the reactor is preferably 0.05 torr to 100 torr, more preferably 0.1 torr to 30 torr, and much more preferably 0.5 torr to 10 torr. The partial pressure of oxygen is preferably 0.04 torr to 80 torr, more preferably 0.1 torr to 25 torr, and much more preferably 0.5 torr to 10 torr.

A nozzle can be used to feed material gases onto the substrate surface, and the shape of the nozzle used is preferably such that its opening is narrowed toward the substrate. To make the film's inside uniform, the opening of the nozzle is preferably circular. The distance between the nozzle and the substrate is preferably 0.5 mm to 40 mm, more preferably 1 mm to 20 mm, and much more preferably 2 mm to 10 mm. The distance outside the above range might result in inferior film surface roughness.

With such a nozzle, the film forming rate falls in the preferable range of, not limited to, about 0.1 μm/hr to 5 μm/hr, thereby a single crystal film is obtained in a stable manner.

PZT as a preferable lead zirconate titanate-based material for this invention is as follows.

PZT is represented by the general formula $Pb(Zr, TiO)_3$; however, PZT in which part of Pb has been replaced with La, that is, (PLZT) or with Nb or Ca is referred to broadly as PZT system. $PbTiO_3$ and $PbZrO_3$ form a complete solid solution and become a ferroelectric material in the wide Zr/Ti ratio range except for the region close to $PbZrO_3$. There exists a morphotoropic phase boundary in PZT in the vicinity of $Zr/(Zr+Ti)=0.52$, and generally the crystal structure of PZT on the Zr rich side of the phase boundary is tetragonal, while the crystal structure of PZT on the Ti rich side of the phase boundary is rhombohedral. This invention has been made based on the finding that an epitaxial crystal having a composition in the vicinity of the morphotropic phase boundary and a {111} orientation shows excellent dielectric characteristics. Curie temperature Tc continuously changes between 230° C. of $PbZrO_3$ and 490° C. of $PbTiO_3$ depending on the Zr/Ti ratio.

Figure 3:
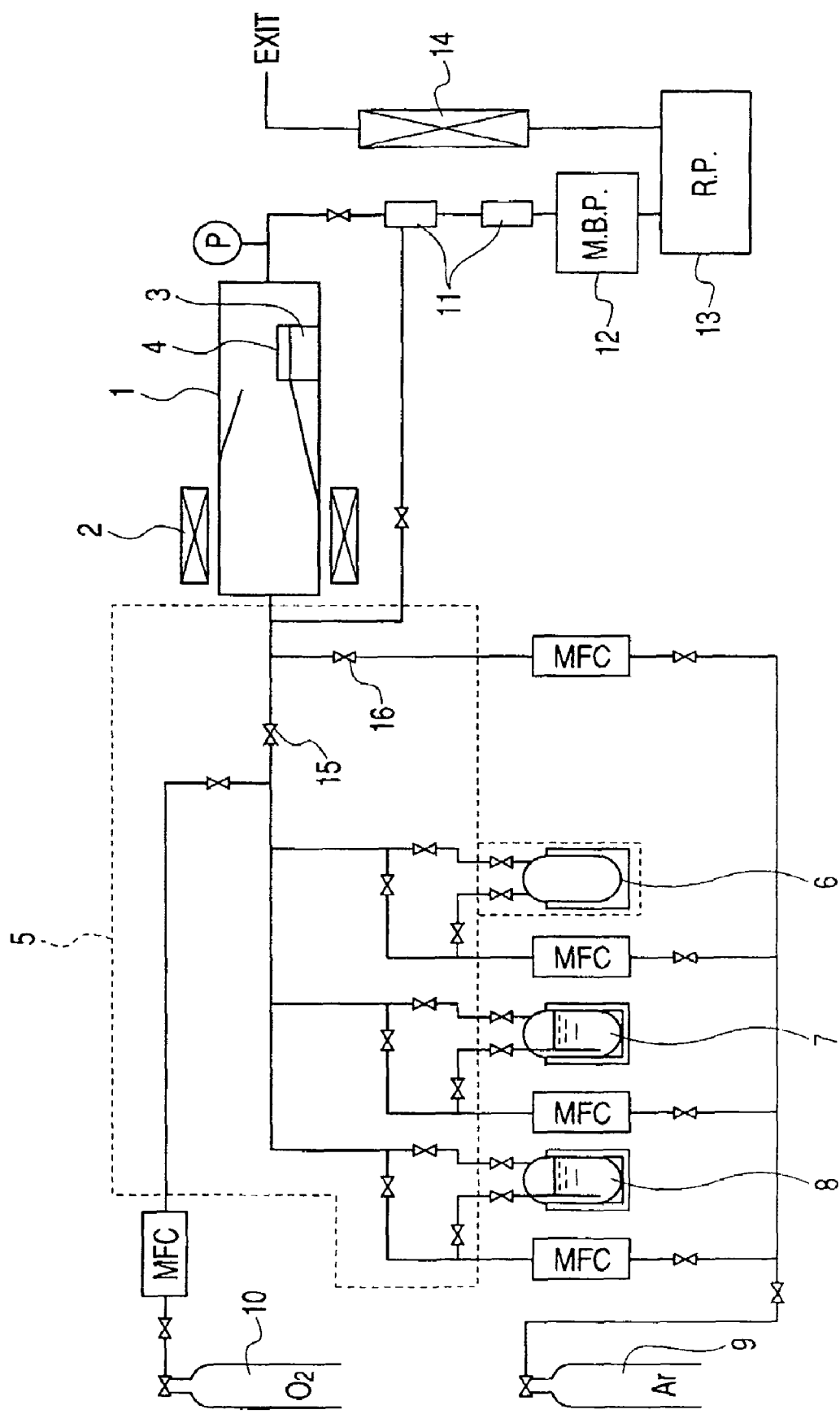
FIG. 3 is a schematic view of one example of MOCVD apparatuses.

Although the material gases for PZT have been already described above, the method of this invention will be further described taking a typical example, in which $Pb(C_7H_{19}O_2)_2$, $Zr(O.t-C_4H_9)_4$, $Ti(O.i-C_3H_7)_4$ and $O_2$ are used, with reference to FIG. 3. FIG. 3 is a schematic view showing one example of MOCVD apparatus for forming PZT films. In this apparatus, a cold wall type of reactor 1 is provided with pre-heating means 2 and a substrate 4 is placed on a heating susceptor 3 in the reactor 1. $Pb(C_{11}H_{19}O_2)_2$ as a Pb material 6 is in the solid state at room temperature, therefore, it is heated in an oven 5 and vaporized while blowing Ar as a carrier gas over its upper portion. $Zr(O.t-C_4H_9)_4$ as a Zr material 7 and $Ti(O.i-C_3H_7)_4$ as a Ti material are in the liquid state at room temperature, therefore, they are heated and vaporized while bubbling Ar as a carrier gas. Reference numeral 9 denotes an argon cylinder numeral 10 an oxygen cylinder. The carrier gas may be $N_2$ or He. The air in the reactor 1 is evacuated through filters 11 with a mechanical booster pump 12 and a rotary pump 13 and discharged outside through a hazardous material remover 14. The material gases generated from the respective material sources are mixed together and fed into the reactor 1 in the form of a mixed gas. The mixed material gas reacts on the heated substrate 4 to deposit PZT thereon.

The Pb/Zr/Ti molar ratio and the $O_2$/Pb molar ratio of the material gas mixture are adjusted depending on the desired PZT composition. For example, Zr/(Zr+Ti)=0.48 or 0.52 and Pb/(Pb+Zr+Ti)=0.5. However, the $O_2$/Pb molar ratio need not be very strictly adjusted, as long as a needed amount or more of $O_2$ and Pb is supplied.

As to the substrate for PZT, (111) Pt/Ti/$SiO_2$/Si, Ir/$TiO_2$/$SiO_2$/Si and $IrO_2$ have been known as suitable multi-crystal PZT growth substrates and (100) $SrRuO_3$/(100) $SrTiO_3$, (111) $SrRuO_3$/(111) $SrTiO_3$, (110) $SrRuO_3$/(110) $SrTiO_3$ have been known as suitable epitaxial crystal PZT growth substrates. However, in this invention, a substrate is used which allows the desirable growth of an epitaxial (111) PZT crystal. Other substrates such as, for example, (111) Pt//(100) YSZ//(100) Si and (111) Pt//(111) YSZ//(111) Si can also be used (YSZ represents yttrium-stabilized zirconia $YZrO_2$). Pt in the above substrates can be replaced with Ir, $SrRuO_3$, $LaNiO_3$ or $LaSrCoO_3$ YSZ can be replaced with $CeO_2$, MgO or SrO. In this example, (111) $SrRuO_3$/(111) $SrTiO_3$ is used as the substrate 4. {111} oriented substrates other than (111) oriented one can also be used as the substrate 4.

As described above, the material gas mixture is introduced into the reactor 1 so as to deposit PZT on the substrate 4, and in this example, the material gas is fed intermittently (in a pulsing manner). For example, the material gas feeding time is 5 to 10 seconds and the time interval is 0 to 20 seconds. A valve 15 is used to start or stop the material gas feeding, and at the same time, a valve 16 is used to introduce a purge gas into the reactor 1 while the material gas feeding is stopped. The introduction of a purge gas ensures the intermittent deposition of PZT.

The method of this invention has been described with reference to the apparatus shown in FIG. 3; however, the construction of MOCVD apparatus is not limited to that shown in FIG. 3. For example, the apparatus may have a vertical reactor.

The thickness of the ferroelectric material thin film, such as PZT thin film, deposited on the substrate is not limited to any specific one and determined depending on its application. Generally, it is 10 to 250 nm for the memory application, 1 to 10 µm for the actuator application, and about 10 µm or less for the micro machine application. Since the permittivity is saturated at a film thickness of about 250 nm, the thickness of 250 nm or less is common for the memory application.

When producing a ferroelectric memory, actuator or micro machine using the lead zirconate titanate-based material formed as above, the construction and the production method can be the same as the conventional ones.

As a substrate material that allows the epitaxial growth of a lead zirconate titanate-based film, an oxide having a perovskite structure, such as $SrRuO_3$, $CaRuO_3$, $LaNiO_3$ or $LaSrCoO_3$, is useful. Pt, Ir, $IrO_2$ also allows the epitaxial growth of a lead titanate-based film if its substrate is properly selected. Generally, the requirement that a substrate has to meet to allow the epitaxial growth of a lead zirconate titanate-based film is that the difference in lattice constant between the substrate and the intended zirconate titanate-based compound is less than 10%.

There have been reported several cases in which Pt, Ir or $IrO_2$ is used to allow the growth of a one-axially oriented film of a lead zirconate titanate-based material, such as PZT, but no case in which Pt, Ir or $IrO_2$ is used to allow the epitaxial growth of the same. However, as described above, if a substrate of Pt, Ir or $IrO_2$ is properly selected, PZT can also be epitaxially grown on the substrate of Pt, Ir or $IrO_2$.

Further, if the substrate is electrically conductive, it can be used as an underelectrode after completing the film formation; therefore, such a substrate is useful in constructing a high-performance dielectric device. $SrRuO_3$, $CaRuO_3$, $LaNiO_3$, $LaSrCoO_3$, and besides, Pt, Ir, $IrO_2$ are conductive substrates.

Although the lead zirconate titanate-based epitaxial film of this invention is useful as a dielectric film such as ferroelectric film, piezoelectric film or pyroelectric film, when it is used as a constituent of a ferroelectric device, piezoelectric device or pyroelectric device, it must be formed an electrically conductive substrate. For this purpose, as a conductive material that allows the growth of a lead zirconate titanate-based oriented or epitaxial film, an electrically conductive material is useful which is selected from the oxides having a perovskite structure such as $SrRuO_3$, $CaRuO_3$, $LaNiO_3$ and $LaSrCoO_3$. If the substrate is electrically conductive, it can be used as an underelectrode after completing the film formation, and therefore, it is useful in constructing a high performance dielectric device. Metals such as Pt and Ir also allow the formation of an epitaxial film, and these are very useful in this invention from the viewpoint of production economy.

These substrate materials may be used for only the surface of a substrate. For example, $SrRuO_3$ can be used as $SrRuO_3$//$SrTiO_3$.

The applications of the dielectric film of this invention and the dielectric device including the same are, not limited to, micro machines that use electrostriction; piezoelectric devices for use in MEMS and ink jet printer heads; ferroelectric devices, such as FeRAM, that use high ferroelectric characteristics; devices, such as an optical shutter, that use a large electro-optical effect expected from a large permittivity change; and devices, such as IR sensor and bolometer, that use pyroelectric characteristics which are related to ferroelectric characteristics.

EXAMPLES

Example 1

Figure 4:
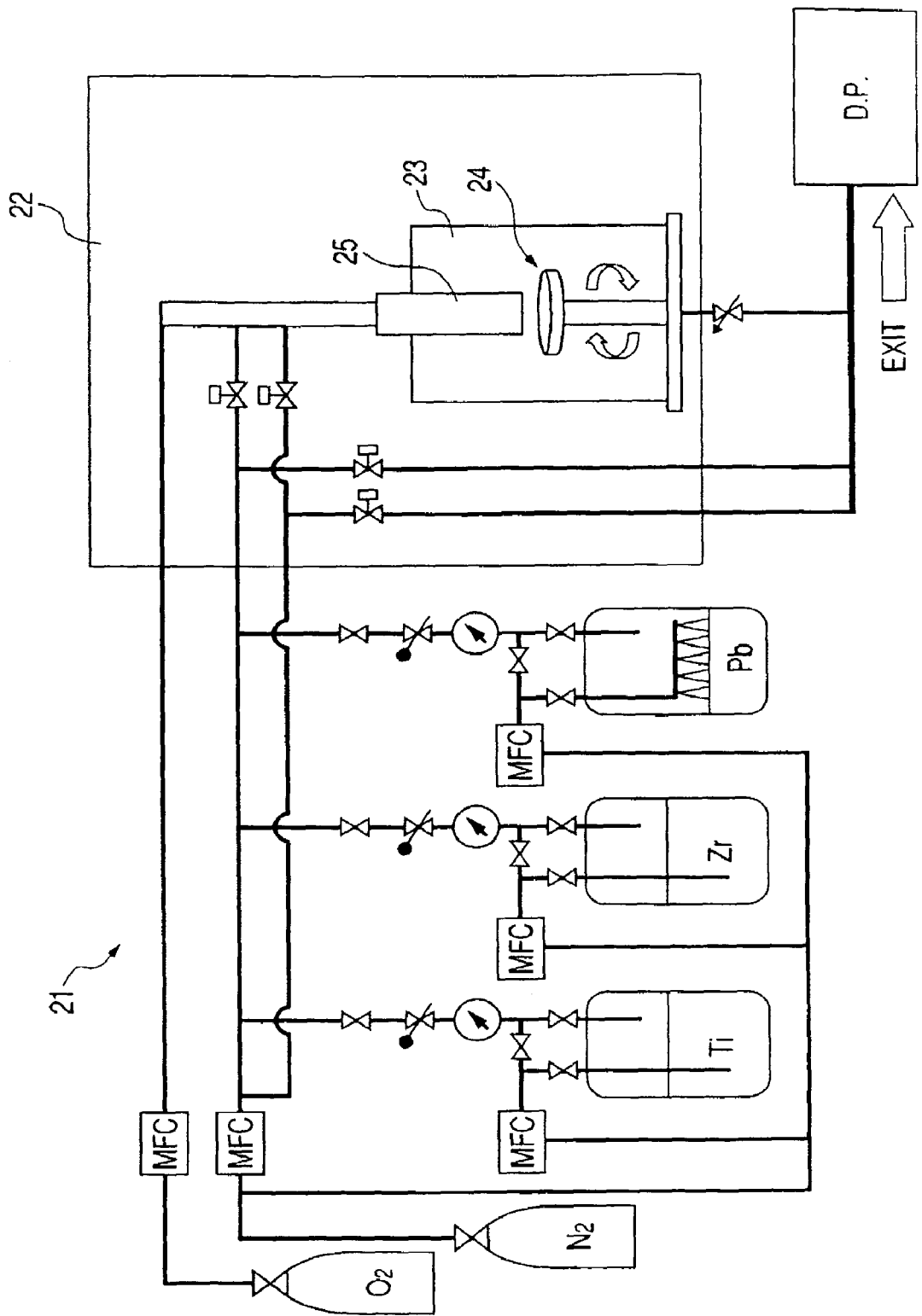
FIG. 4 is an illustration of the vertical MOCVD apparatus used in the examples of this invention.
Figure 5:
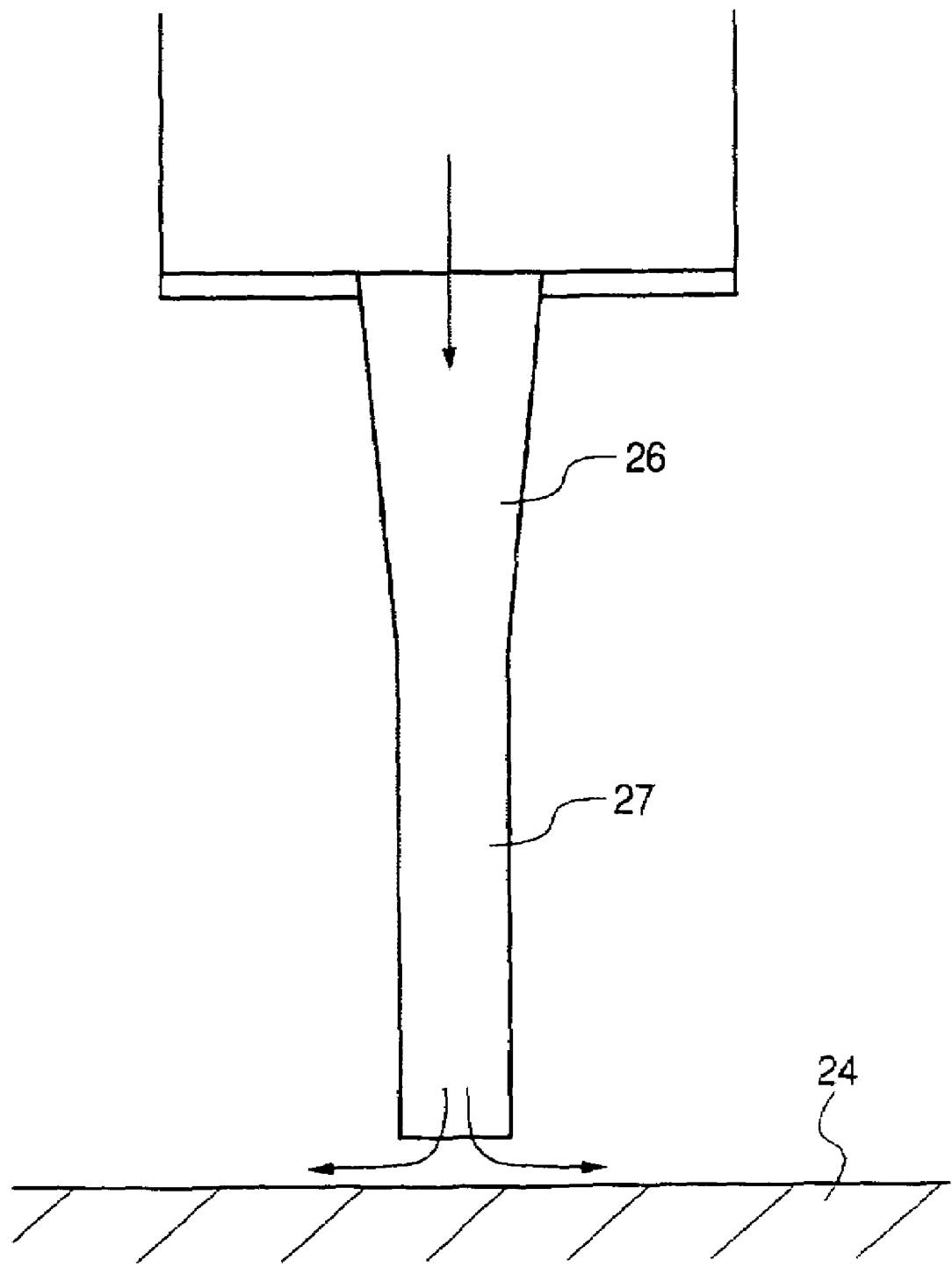
FIG. 5 is an illustration of the nozzle of the MOCVD apparatus used in the examples of this invention.

Epitaxial deposition of PZT was carried out in accordance with the method described in the examples of Japanese Patent Application Laid-Open No. 2001-220676, except that a vertical MOCVD apparatus was used as shown in FIG. 4. The material feeding system 21 of this apparatus was the same as that shown in FIG. 3, but as a carrier gas was used a nitrogen $N_2$ gas. A reactor 23 within an oven 22 was provided with a substrate holder 24 equipped with a heater, and a mixed material gas, which had been mixed in advance, was fed onto the surface of each substrate from above the substrates held in the substrate holder 24 through a nozzle 25 shown in FIG. 5. The nozzle 25 had a total length of 340 mm. The upper portion 26, 150 mm long, of the nozzle was tapered with its inside diameter reduced from 58 mm to 37 mm, while the lower portion 27, 150 mm long, was in the form of a cylinder 1.5 mm thick and uniform in inside diameter (37 mm) whose tip was flat. The nozzle was used to feed mixed material gas onto the surface of each substrate, which was arranged at a relatively close distance from the tip of the nozzle (the space between the tip of the nozzle and the substrate surface: 6 mm) in such a manner as to be parallel to the same, and was designed to be able to feed a mixed material gas uniformly onto the substrate surface while avoiding the occurrence of turbulent flow of the gas. Seven square substrates with sides 10 mm were arranged on the substrate holder in such a manner as to keep the space between the center of the substrate holder rotation and the side of each substrate facing the above center 13 mm and spacing the seven substrates at equal intervals. And the substrate holder was rotated when used.

PZT epitaxial films were formed on (100) $SrRuO_3$//(100) $SrTiO_3$, (110) $SrRuO_3$//(110) $SrTiO_3$ and (111) $SrRuO_3$//(111) $SrTiO_3$ substrates at a deposition temperature of 600° C. by pulse MOCVD, in which material gases were fed into the vertical reactor intermittently, using $Pb(C_{11}H_{19}O_2)_2$, $Zr(O-t-C_4H_9)_4$, $Ti(O-i-C_3H_7)_4$ and $O_2$ as starting materials. The composition [Zr/(Zr+Ti) ratio, that is, y] of the films was controlled while keeping the Pb/(Pb+Zr+Ti) ratio constant, 0.50, and adjusting the amount of material gases shared. The film thickness was controlled while changing the deposition time.

The heating temperatures for the above materials of Pb, Zr and Ti were set at 142.5° C., 36.0° C. and 42.0° C., respectively, and the carrier gas $N_2$ was flown at flow rates of 80, 60 and 60 cm$^3$/min, respectively. For Zr and Ti materials, bubbling of $N_2$ gas was started 35 min before starting the film formation to vaporize them. The material gases were mixed prior to the introduction into the reactor and the resultant mixed gas was fed onto the substrates which were rotated at 1.0 rpm. The space between the nozzle and each substrate was 6 mm at the time of the mixed gas feeding. The total pressure of the reactor was 8 torr and the partial pressure of oxygen was 6.5 torr. The film thickness was controlled while changing the deposition time. The thickness of the resultant films was 500 nm to 7000 nm (7 μm).

The crystal structure analysis of the produced films was carried out with a high-resolution X-ray diffractometer provided with 4 axes (XRD, PANalytical X'pert-MRD) and the composition analysis of the same with a wavelength dispersion type of fluorescent X-ray spectroscopy (XRF, PANalytical PW2404). The thickness of the films was measured with a contact type film thickness meter, Dektak, an XRF and a scanning electron microscope (FE-SEM, s-2500 Hitachi).

Upper Pt electrodes 100 μm in diameter and 200 μm in diameter were formed by electron beam evaporation using a metal mask. The ferroelectric characteristics and dielectric characteristics were evaluated with ferroelectric testers RT6000, FCE-1 (Toyo Corporation), FCE-PZ (Toyo Corporation) and HP4194A.

The electrostriction was measured with an atomic force microscope (AFM, API3800 SII, Nano-R, Toyo Corporation) in combination with a ferroelectric tester FCE-1 or FCE-PZ.

X-ray diffraction analysis was conducted for the PZT films formed on the (100) $SrRuO_3$//(1.00) $SrTiO_3$ substrate, the (110) $SrRuO_3$//(110) $SrTiO_3$ substrate and the (111) $SrRuO_3$//(111) $SrTiO_3$ substrate and having composition ratios y=0.75 (rhombohedral crystal), y=0.48 (in the vicinity of morphotoropic phase boundary) and y=0.39 (tetragonal crystal). FIG. 6 shows XRD patterns of PZT films formed on the (111) $SrRuO_3$//(111) $SrTiO_3$ substrate and having composition ratios y=0.75 (rhombohedral crystal), y=0.48 (in the vicinity of morphotoropic phase boundary) and y=0.39 (tetragonal crystal), respectively.

The analysis confirmed that in any one of the above three types of PZT films formed on the substrate, there were observed no peaks other than those identified as the PZT peaks. And the pole figures confirmed that the films were epitaxially grown. The half-width in the circumferential direction in the pole figures was 8°. There have been reported no PZT epitaxial films at least as {111} orientated PZT films.

The half-width of the locking curve at 2θ=38.5° in the {111} orientated PZT films was 0.6 to 0.7° and the crystal orientation was almost perfect.

Figure 7:
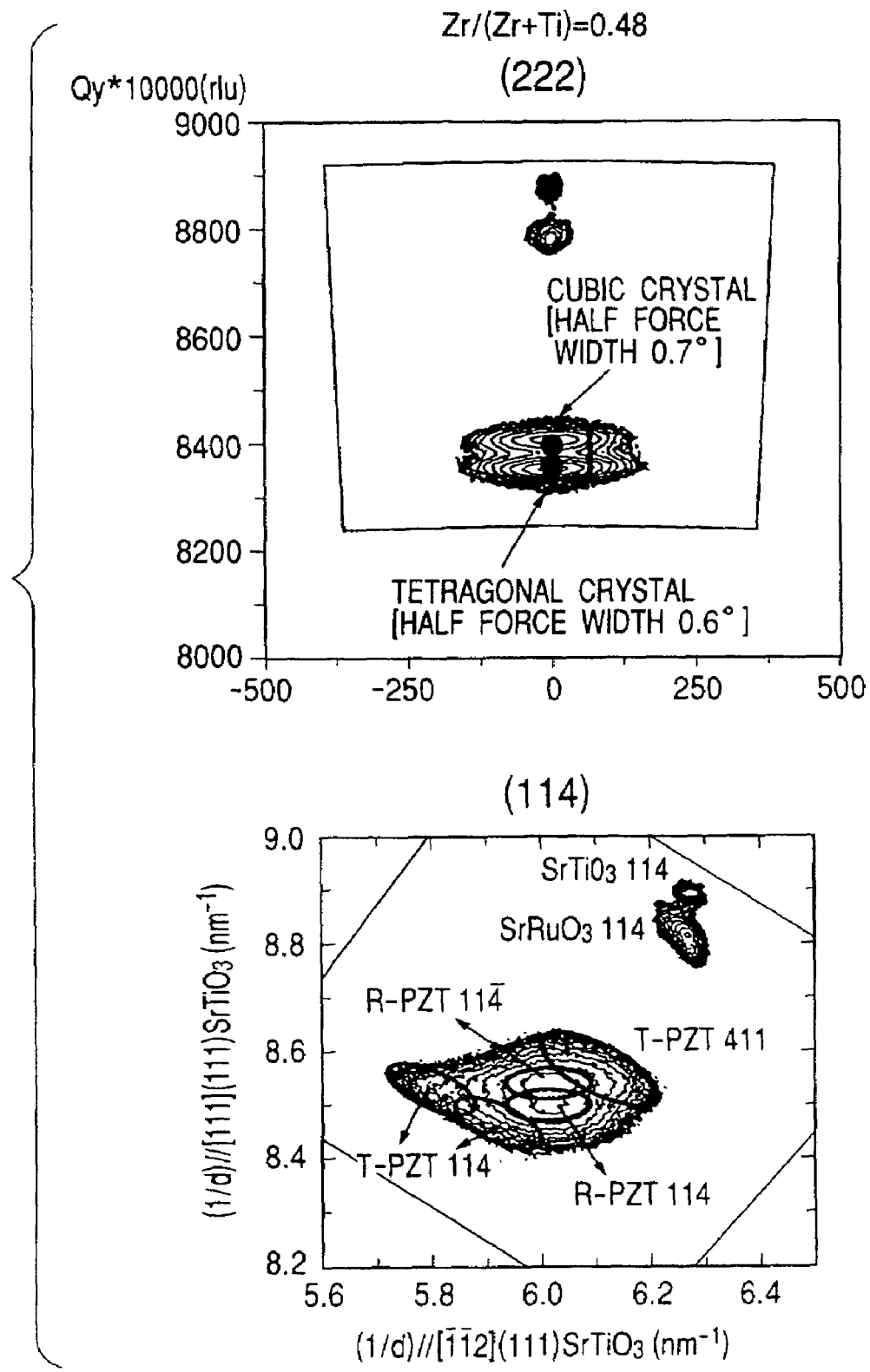
FIG. 7 is a view showing an X-ray reciprocal mapping image of the (222) face of PZT.

At the composition ratio y=0.48 (in the vicinity of morphotoropic phase boundary), there was detected the coexistence of at least two of tetragonal crystal, cubic crystal and rhombohedral crystal. This case has never been reported before. FIG. 7 shows one example of X-ray reciprocal mapping images of (222) face and (114) face that shows the existence of a mixed crystal and the completeness of the crystals.

Figure 8:
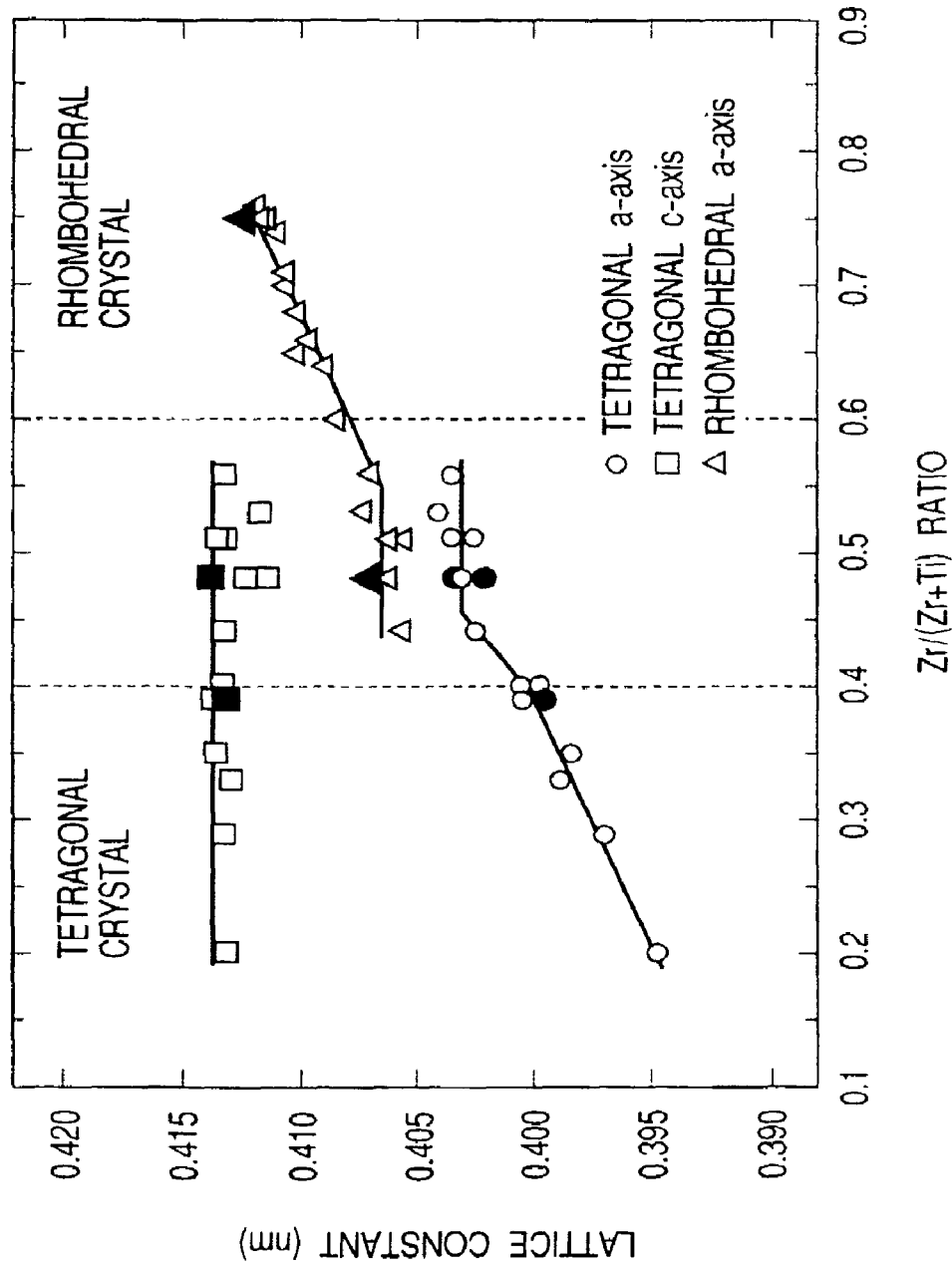
FIG. 8 illustrates the composition dependency of the lattice constant of PZT.

FIG. 8 shows the composition dependency of the lattice constant of (100) PZT. The composition range in the vicinity of the morphotoropic phase boundary of this invention selected based on the lattice constant was y≦0.40 to 0.65.

Figure 9:
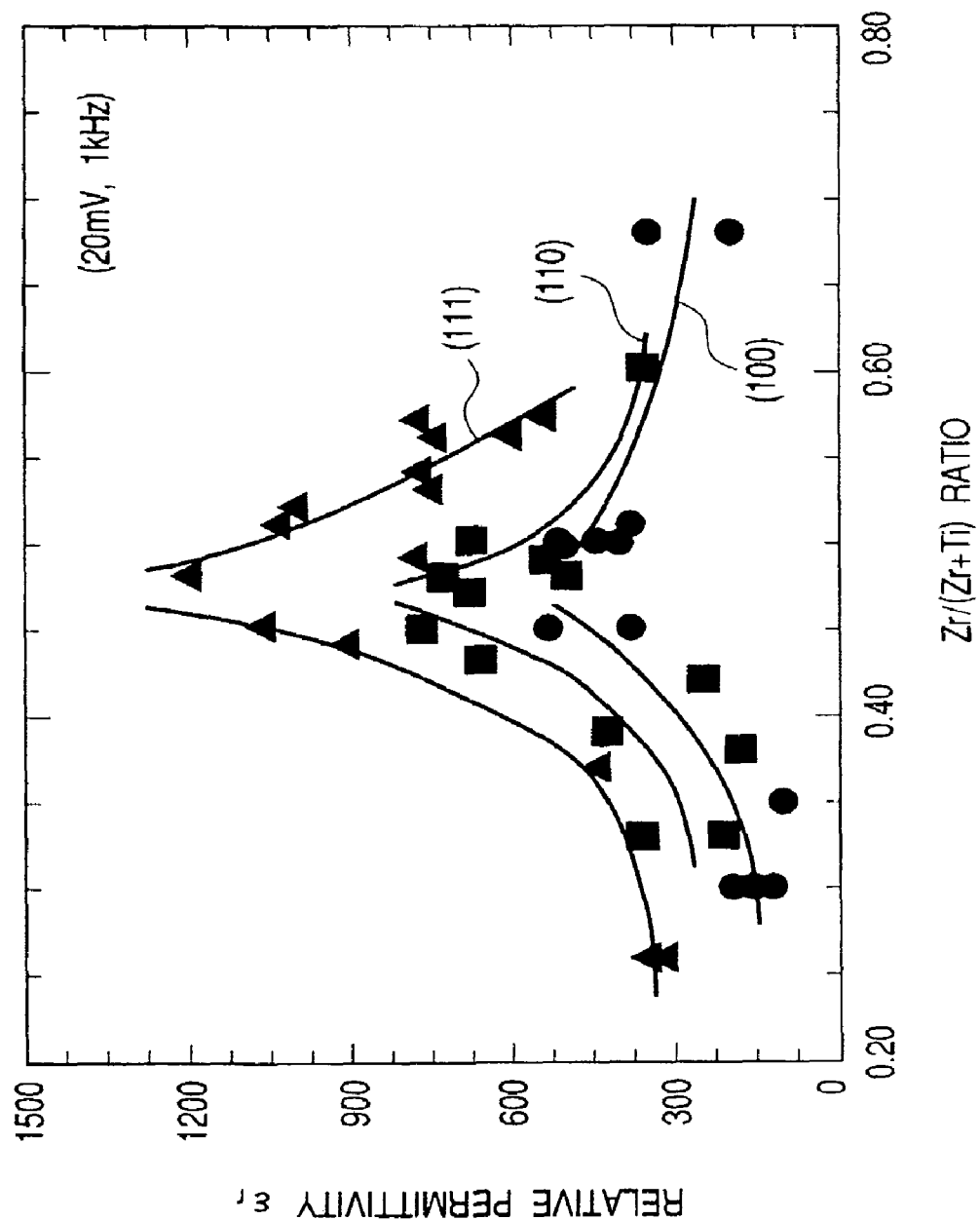
FIG. 9 illustrates the composition and crystal orientation dependency of the relative permittivity $\epsilon_r$ of PZT films.

FIG. 9 shows the composition and crystal orientation dependency of the relative permittivity $\epsilon_r$. The figure confirms that relative permittivity $\epsilon_r$ has a maximum in the range of Zr/(Zr+Ti)=y=0.40 to 0.65 in the vicinity of the morphotoropic phase boundary independently of the crystal orientation and is high in the (111) orientated film independently of the composition.

Figure 10:
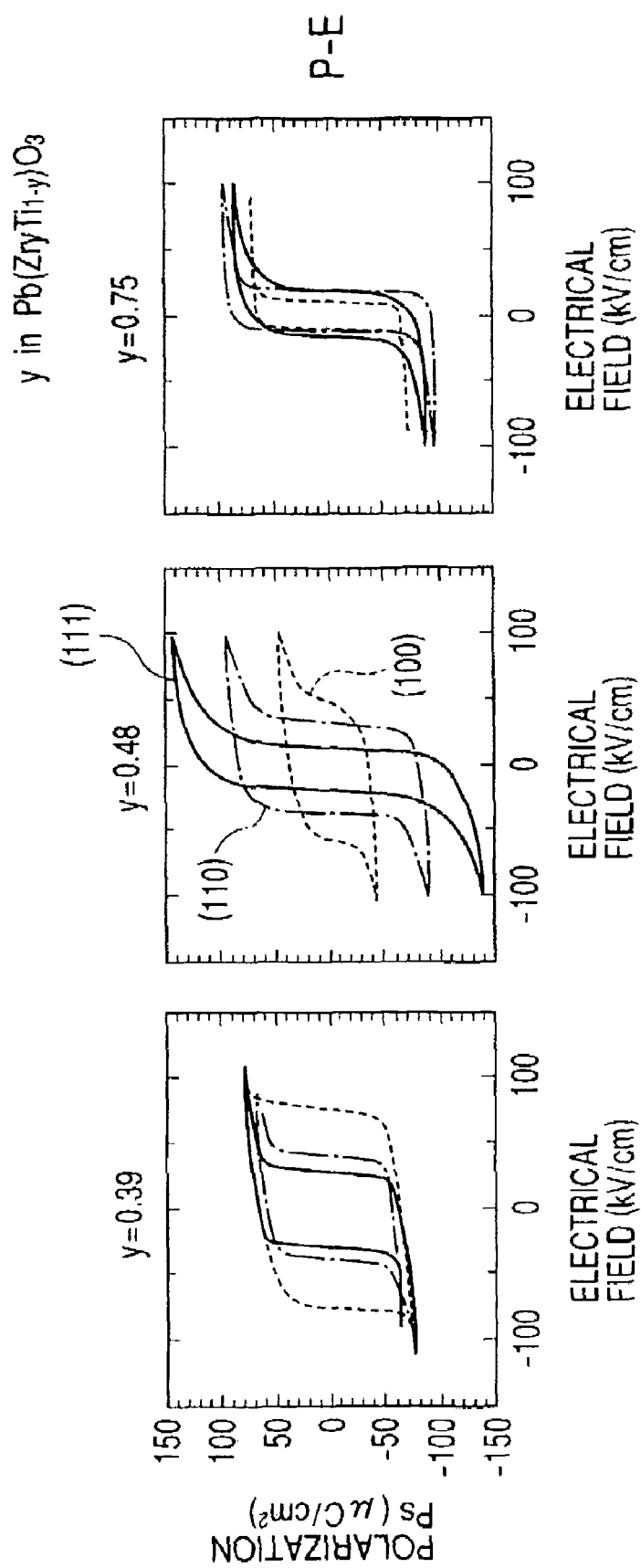
FIG. 10 illustrates the composition and crystal orientation dependency of the polarization-voltage characteristics (P-E characteristics) of PZT films.

FIG. 10 shows the composition and crystal orientation dependency of the polarization-voltage characteristics (P-E characteristics) of the PZT films. The data are on the PZT films of y=0.39 (tetragonal crystal), y=0.48 (in the vicinity of the morphotoropic phase boundary) and y=0.75 (rhombohedral crystal) and (100) orientation, (110) orientation and (111) orientation. The figure confirms that the film having a composition in the vicinity of the morphotoropic phase boundary and (111) orientation shows particularly high polarization Pr.

FIG. 11 shows the composition and crystal orientation dependency of the relative permittivity-voltage characteristics (C-E characteristics) of the PZT films. The data are on the PZT films of y=0.39 (tetragonal crystal), y=0.48 (in the vicinity of the morphotoropic phase boundary) and y=0.75 (rhombohedral crystal) and (100) orientation, (110) orientation and (111) orientation. The figure confirms that the film having a composition in the vicinity of the morphotoropic phase boundary and (111) orientation shows particularly high relative permittivity. As shown in FIG. 11, the film having a composition of y=0.48 shows Δε/ΔE of as high as 10 or more. The films having a composition within the range of 0.43≦y≦0.57 preferably show Δε/ΔE of 3 or more and their piezoelectric characteristics are also good.

Figure 12:
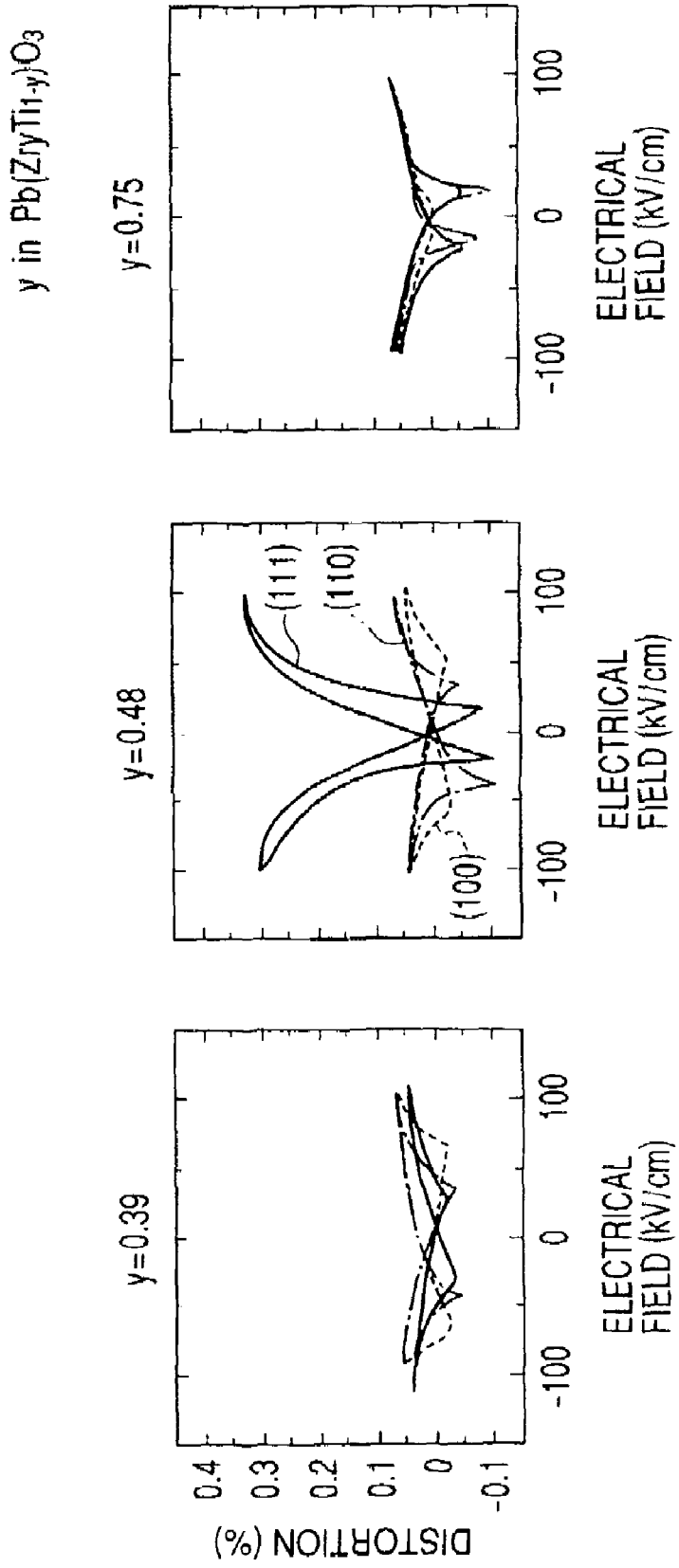
FIG. 12 illustrates the composition and crystal orientation dependency of the piezorestrictivity-voltage characteristics (S-E characteristics) of PZT films.

FIG. 12 shows the composition and crystal orientation dependency of the piezorestictivity-voltage characteristics (S-E characteristics) of the PZT films (2.5 μm thick). The data are on the PZT films of y=0.39 (tetragonal crystal), y=0.48 (in the vicinity of the morphotoropic phase boundary) and y=0.75 (rhombohedral crystal) and (100) orientation, (110) orientation and (111) orientation. The figure confirms that the film having a composition in the vicinity of the morphotoropic phase boundary and (111) orientation shows particularly high piezorestictivity.

Figure 13:
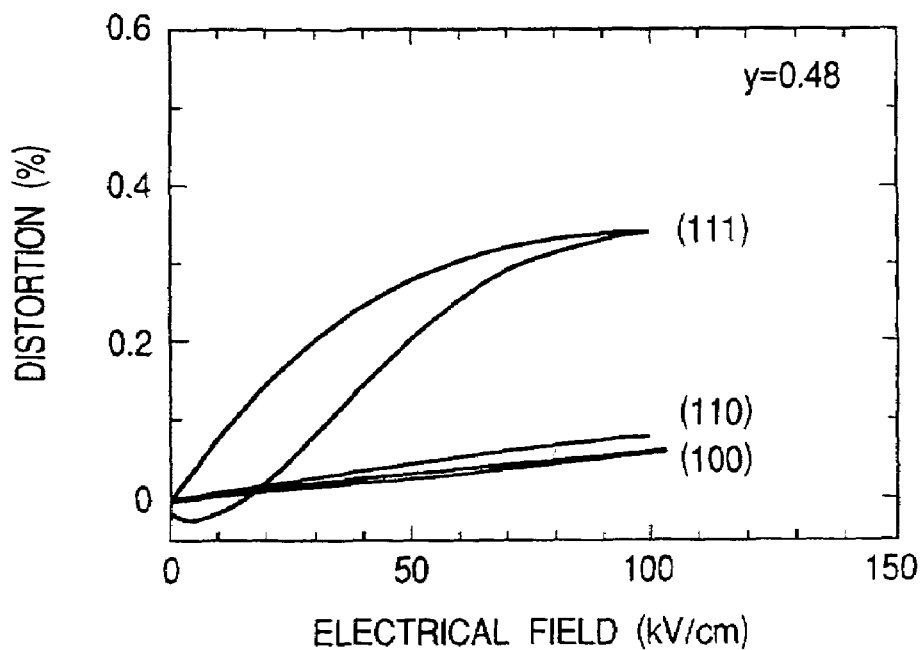
FIG. 13 illustrates S-E curves of (100) orientated, (110) orientated and (111) orientated PZT films having a composition ratio y=0.48 (morphotoropic phase boundary) when applying unipolar electric field.

FIG. 13 shows S-E curves of the films having a composition of y=0.48 (in the vicinity of the morphotoropic phase boundary) and orientations of (100), (110) and (111) when applying unipolar electric field thereto. The figure also confirms that the film having a composition in the vicinity of the morphotoropic phase boundary and (111) orientation shows particularly high piezorestictivity. Although FIGS. 9 to 13 show the data on y=0.48, the data obtained while changing the y value little by little (including the data shown in FIGS. 6 and 7) confirm that excellent results are obtained when y—in the range of about 0.40 to about 0.65, about 0.43 to about 0.65, about 0.43 to about 0.57, and particularly about 0.45 to about 0.55.

Figure 14:
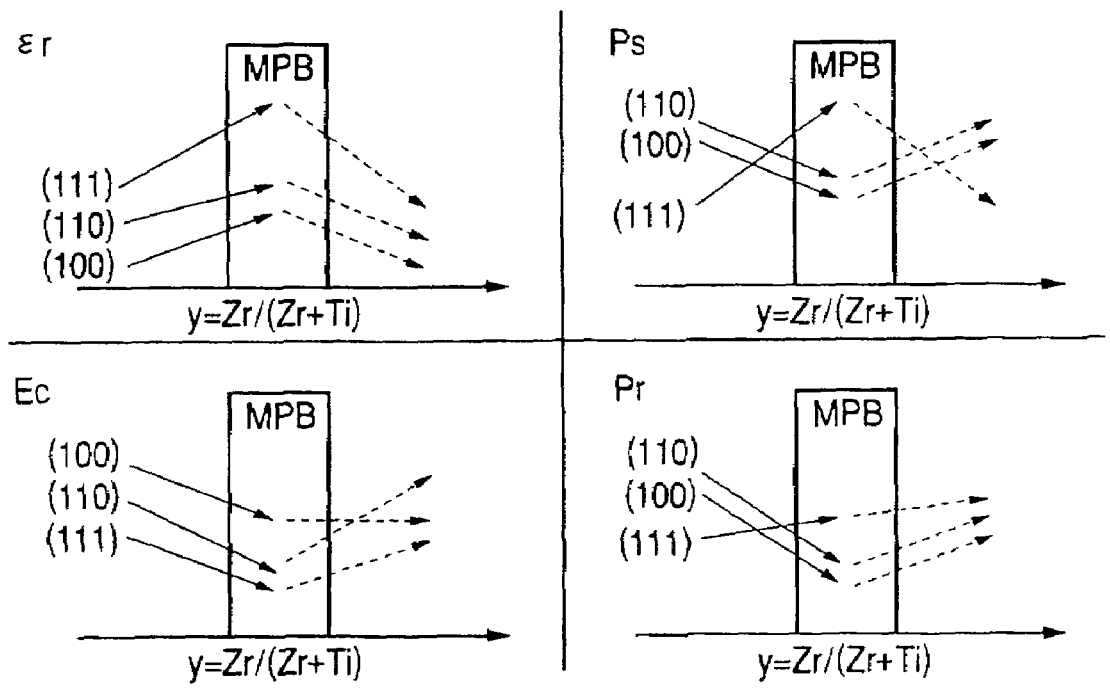
FIG. 14 summarizes and schematically illustrates the composition and crystal orientation dependency of the relative permittivity $\epsilon_r$, spontaneous polarization Ps, coercive electric field Ec and residual dielectric polarization Pr of PZT films.

FIG. 14 summarizes and schematically illustrates the composition and crystal orientation dependency of the relative permittivity $\epsilon_r$, spontaneous polarization Ps, coercive electric field Ec and residual dielectric polarization Pr of the PZT epitaxial films Example 2

PZT epitaxial films each having a (111) orientation were formed in the same manner as in example 1, except that the composition ratio was Zr/(Zr+i)=0.53.

Figure 15:
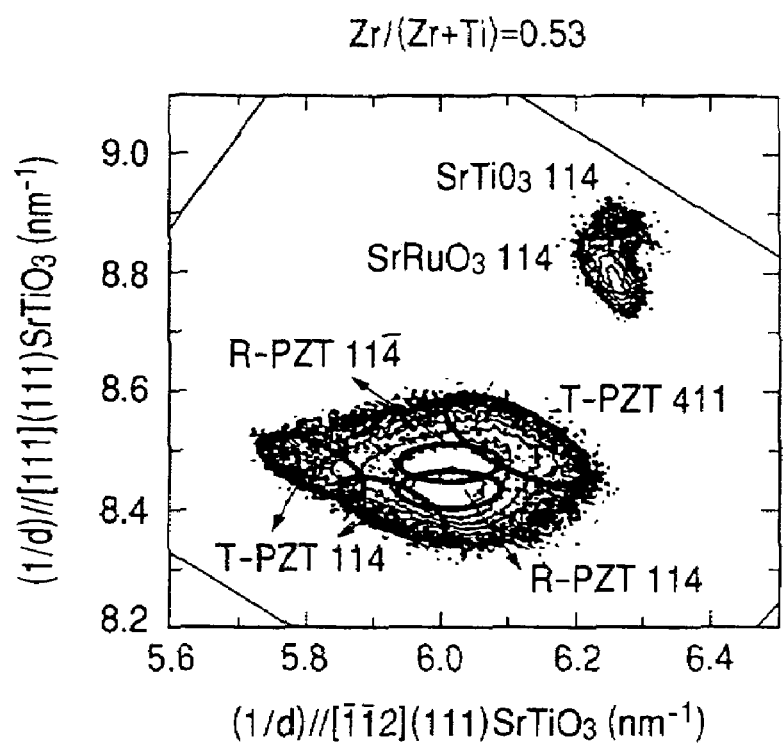
FIG. 15 is a view showing an X-ray reciprocal mapping image of the (114) face of a (111) orientated PZT epitaxial film having a composition ratio of Zr/(Zr+Ti)=0.53.

The characteristics of the resultant PZT films were evaluated in the same manner as in example 1, and the evaluation confirmed that the films had a mixed crystal structure of tetragonal crystal and rhombohedral crystal and had excellent dielectric characteristics, like those in example 1. The half-width of the tetragonal crystal was 0.9° and that of the rhombohedral crystal was 0.7°. FIG. 15 shows one example of X-ray reciprocal mapping images of the (114) face of (111) orientated PZT films. The $\Delta\epsilon/\Delta E$ of the films was 5.5.

Example 3

PZLT epitaxial films each having a (111) orientation were formed in the same manner as in example 1, except that the composition ratio Zr/(Zr+Ti) was changed.

Figure 16:
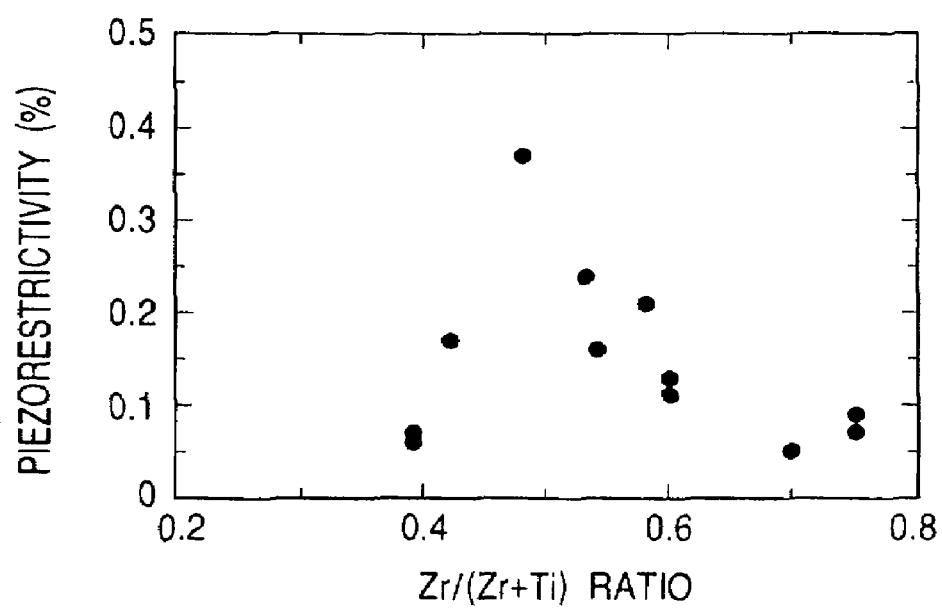
FIG. 16 is a graph showing the relationship between the value of piezorestrictivity and Zr/(Zr+Ti) ratio of the PLZT film formed in the example of this invention.

The characteristics of the resultant PLZT films were evaluated in the same manner as in example 1, and the same results as in example 1 were obtained. FIG. 16 shows the relationship between the value of piezorestrictivity and Zr/(Zr+Ti) ratio of the resultant PLZT films. The figure confirms that piezorestictivity is improved when the Zr/(Zr+Ti) ratio is within the range of 0.40 to 0.65. However, when the Zr/(Zr+Ti) ratio is less than 0.43, the residual dielectric polarization Pr and the relative permittivity $\epsilon_r$ tend to be inferior.

Example 4

PZLT epitaxial films each having a (111) orientation were formed in the same manner as in example 1, except that as substrates were used (111)Pt//(100)YSZ//(100)Si and (111)Pt//(111)YSZ//(111)Si. The (111)Pt film could be obtained by forming a Pt film at 680° C. when producing the substrates.

Figure 17:
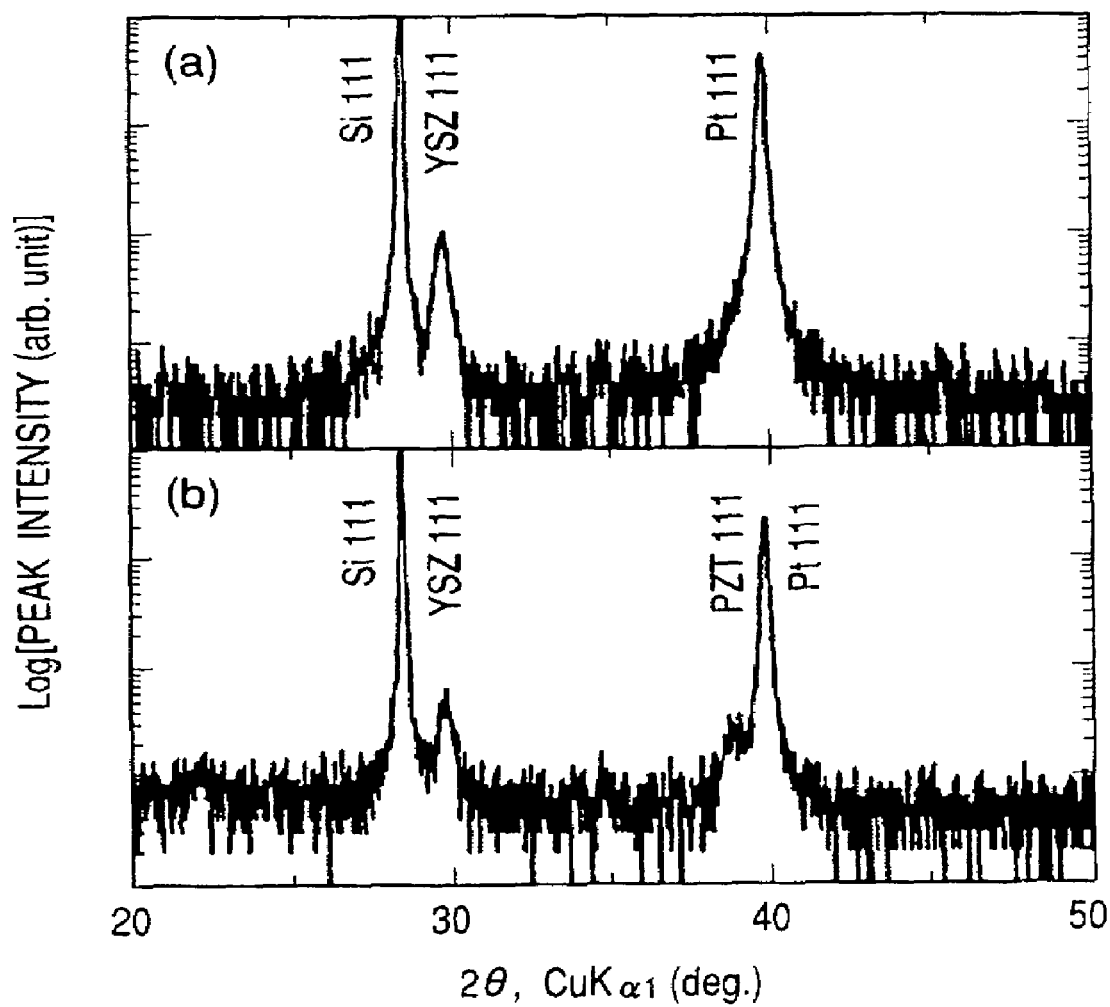
FIG. 17 is a view showing the X-ray diffraction charts of the PLZT films formed on a (111)Pt//(100)YSZ//(100)Si substrate and a (111)Pt//(111)YSZ//(111)Si substrate.
Figure 18:
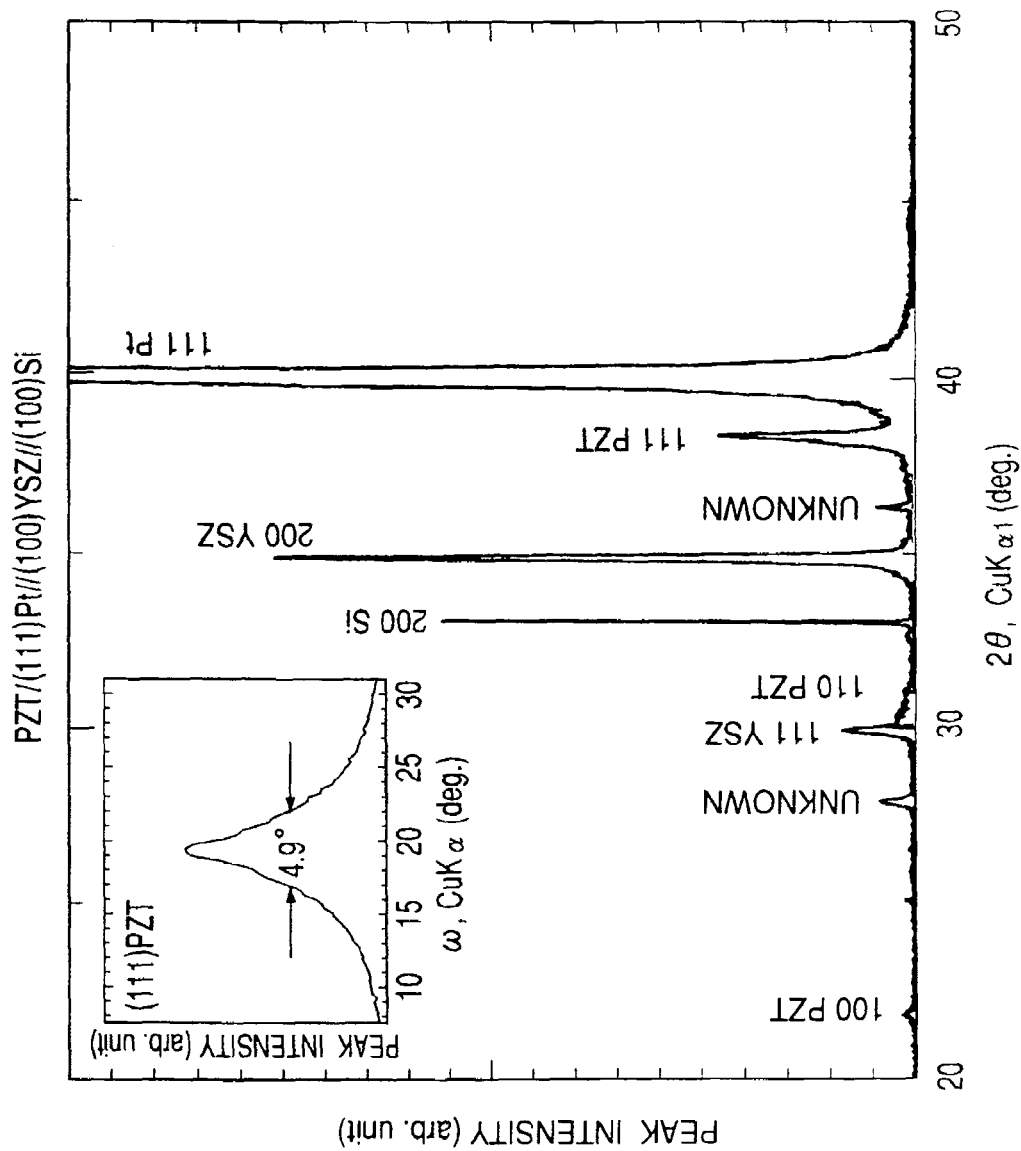
FIG. 18 is a view showing the X-ray diffraction chart of the PLZT film formed on a (111)Pt//(100)YSZ//(100)Si substrate.

FIGS. 17 and 18 show the X-ray diffraction charts of the PZT films formed on the (111)Pt//(100)YSZ//(100)Si substrate and the (111)Pt//(111)YSZ//(111)Si substrate. The figures confirm that PZT epitaxial films each having a (111) orientation are obtained. In the (111) orientated PZT film formed on the (111)Pt//(100)YSZ//(100)Si substrate shown in FIG. 18, the half width of the locking curve at θ=19.3° was 4.9°.

Example 5

PLZT films each having a composition represented by the formula $Pb_{0.94}La_{0.06}Zr_{0.48}Ti_{0.52}O_3$ and a (111) orientation were formed in the same manner as in example 1, except that part of the Pb material, 6 mol %, was replaced with lanthanum material $La(EDMDD)_3$.

The characteristics of the resultant PLZT films were evaluated in the same manner as in example 1 and the similar results as above were obtained. The piezoelectric characteristics were improved compared with the PZT films having the corresponding composition $PbZr_{0.48}Ti_{0.52}O_3$.

Although it has been known that if part of Pb of PZT is replaced with a small amount of La, the resultant PLZT has improved characteristics compared with the PZT, the results confirmed the fact.

Example 6

A PZT film 2 μm thick was formed on a (111)$SrRuO_3$// (111)$SrTiO_3$ substrate in the same manner as in example 1, except that y=0.59. The evaluation of C-E characteristics of the film showed that the $\Delta\epsilon/\Delta E$ was 3.2 and the piezoelectric characteristics were good. XRD measurement revealed that the film was a (111) orientated mixed crystal system.

The Pb composition ratio may be stoichiometric ratio, but it may also be excessive compared with Zr and Ti within the range of 15%.

What is claimed is:

1. A lead zirconate titanate-based thin film, wherein the film is an epitaxial crystal thin film on a substrate, said thin film has a chemical composition represented by the general formula $Pb_{1-x}Ln_xZr_yTi_{1-y}O_3$, wherein Ln represents any one selected from the group consisting of lanthanum, lanthanoid elements, niobium, calcium, barium, strontium, iron, manganese and tin; and $0 \leq x \leq 1, 0.43 \leq y \leq 0.65$ and wherein the film orientation is {111} or within 15° from {111}.

2. The lead zirconate titanate-based thin film according to claim 1, wherein a half-width of a locking curve in the circumferential direction of an X-ray pole figure is within 30°.

3. The lead zirconate titanate-based thin film according to claim 1, wherein a half-width of a locking curve in the circumferential direction of an X-ray pole figure is within 15°.

4. The lead zirconate titanate-based thin film according to claim 1, wherein a half-width of a locking curve of the crystal is within 15°.

5. The lead zirconate titanate-based thin film according to claim 1, wherein a half-width of a locking curve of the crystal is within 5°.

6. The lead zirconate titanate-based thin film according to claim 1, wherein a half-width of a locking curve of the crystal is within 2°.

7. The lead zirconate titanate-based thin film according to claim 1, wherein a half-width of a locking curve of the crystal is within 1°.

8. A lead zirconate titanate-based thin film on a substrate, said thin film having a composition represented by the general formula $Pb_{1-x}Ln_xZr_yTi_{1-y}O_3$, wherein Ln represents any one selected from the group consisting of lanthanum, lanthanoid elements, niobium, calcium, barium, strontium, iron, manganese and tin; $0 \leq x < 1$; and $0.43 \leq y \leq 0.57$, wherein the relative permittivity—voltage characteristics of the film satisfy the following equation: $\Delta\epsilon/\Delta E \geq 3.0$, wherein $\Delta E$ is a change in relative permittivity and $\Delta\epsilon$ is a change in electric field strength (kv/cm).

9. The lead zirconate titanate-based thin film according to claim 8, wherein the relative permittivity—voltage characteristics satisfy the following equation: $\Delta\epsilon/\Delta E \geq 5.0$.

10. The lead zirconate titanate-based thin film according to claim 8, wherein the film is an epitaxial film whose orientation is {111} or within 15° from {111}.

11. The lead zirconate titanate-based thin film according to claim 1 or 10, wherein the {111} face of the epitaxial film is oriented within a tilt angle of 5°, including 0°.

12. The lead zirconate titanate-based thin film according to claim 1 or 10, wherein the {111} face of the epitaxial film is oriented within a tilt angle of 3°.

13. The lead zirconate titanate-based thin film according to claim 1 or 8, wherein the substrate is silicon.

14. The lead zirconate titanate-based thin film according to claim 13, wherein the silicon is {111} oriented.

15. The lead zirconate titanate-based thin film according to claim 13, wherein the silicon is {111} oriented.

16. The lead zirconate titanate-based thin film according to claim 1 or 8, wherein the film is formed by MOCVD.

17. The lead zirconate titanate-based thin film according to claim 1, wherein in the general formula $Pb_{1-x}Ln_xZr_yTi_{1-y}O_3$, $0.43 \leq y \leq 0.57$.

18. The lead zirconate titanate-based thin film according to claim 1, wherein in the general formula $Pb_{1-x}Ln_xZr_yTi_{1-y}O_3$, $0.45 \leq y \leq 0.55$.

19. The lead zirconate titanate-based thin film according to claim 1 or 8, wherein the crystal structure is at least any one of tetragonal, cubic and rhombohedral crystals.

20. The lead zirconate titanate-based thin film according to claim 19, wherein at least any two of tetragonal, cubic and rhombohedral crystals coexist.

21. The lead zirconate titanate-based thin film according to claim 1 or 8, wherein at least the surface of the substrate is electrically conductive.

22. A lead zirconate titanate-based thin film, wherein the film is an epitaxial crystal thin film which has a chemical composition represented by the general formula $Pb_{1-x}Ln_xZr_{1-y}Ti_yO_3$, wherein Ln represents any one selected from the group consisting of lanthanum, lanthanoid elements, niobium, calcium, barium, strontium, iron, manganese and tin; and $0 \leq x < 1$, $0.40 \leq y \leq 0.65$, wherein the film orientation is {111} or within 15° from {111}, or in which at least any two of tetragonal, cubic and rhombohedral crystals coexist.

23. The lead zirconate titanate-based thin film according to claim 22, wherein in the general formula $Pb_{1-x}Ln_xZr_{1-y}Ti_yO_3$, $0.43 \leq y \leq 0.57$.

24. A lead zirconate titanate-based epitaxial thin film formed by MOCVD, wherein the film has a chemical composition represented by the general formula $Pb_{1-x}Ln_xZr_{1-y}Ti_yO_3$, wherein Ln represents any one selected from the group consisting of lanthanum, lanthanoid elements, niobium, calcium, barium, strontium, iron, manganese and tin; and $0 \leq x < 1$, $0.43 \leq y \leq 0.65$ and wherein the film orientation is {111} or within 15° of {111}.

25. A dielectric device, comprising the lead zirconate titanate-based thin film according to any one of claims 1, 8, 22 and 24.

26. A piezoelectric device, comprising the lead zirconate titanate-based thin film according to any one of claims 1, 8, 22 and 24.

27. An ink jet printer head, comprising the piezoelectric device according to claim 26.

28. A ferroelectric device, comprising the lead zirconate titanate-based thin film according to any one of claims 1, 8, 22 and 24.

29. A pyroelectric device, comprising the lead zirconate titanate-based thin film according to any one of claims 1, 8, 22 and 24.

30. A lead zirconate titanate-based thin film, wherein a crystal film which has a chemical composition represented by the general formula $Pb_{1-x}Ln_xZr_{1-y}Ti_yO_3$, wherein Ln represents any one selected from the group consisting of lanthanum, lanthanoid elements, niobium, calcium, barium, strontium, iron, manganese and tin; and $0 \leq x < 1$, $0.43 \leq y \leq 0.65$, wherein the film orientation is {111} is or within 15° of {111} and in which at least any two of tetragonal, cubic or rhombohedral crystals coexist.

* * * * *

UNITED STATES PATENT AND TRADEMARK OFFICE
CERTIFICATE OF CORRECTION

PATENT NO. : 7,042,141 B2
APPLICATION NO. : 10/777120
DATED : May 9, 2006
INVENTOR(S) : Hiroshi Funakubo et al.

It is certified that error appears in the above-identified patent and that said Letters Patent is hereby corrected as shown below:

ON THE TITLE PAGE [56] REFERENCES CITED:

Foreign Patent Documents, "JP     01-220676     8/2001" should read --JP    2001-220676    8/2001--; and "JP    03-017767    1/2003" should read --JP    2003-017767   1/2003--.

COLUMN 1:

Line 51, "have" should read --has--.

COLUMN 2:

Line 56, "$0.43 \leq y < 0.57$" should read --$0.43 \leq y \leq 0.57$--.

COLUMN 4:

Line 13, "$0.43 \leq y \leq 50.65)$" should read --$0.43 \leq y \leq 0.65)$--.

COLUMN 6:

Line 29, "rage" should read --range--; and "rage" (second occurrence) should read --range--;
Line 30, "rage" should read --range--;
Line 31, "rage" should read --range--;
Line 35, "have shown" should read --has shown--;
Line 45, "rage" should read --range--;
Line 46, "rage" should read --range--;
Line 49, "electrostriction" should read --piezoelectric--;
Line 53, "showed" should read --shown--.

COLUMN 7:

Line 2, "if each" should read --of each--;
Line 29, "that-such" should read --that such--; and
Line 36, "smaller tile" should read --smaller the--.

COLUMN 8:

Line 13, "a electric" should read --an electric--;
Line 25, "do)" should read --do--; and
Line 29, "film-" should read --film--.

UNITED STATES PATENT AND TRADEMARK OFFICE
CERTIFICATE OF CORRECTION

PATENT NO. : 7,042,141 B2
APPLICATION NO. : 10/777120
DATED : May 9, 2006
INVENTOR(S) : Hiroshi Funakubo et al.

It is certified that error appears in the above-identified patent and that said Letters Patent is hereby corrected as shown below:

COLUMN 9:

Line 21, "$Pb(C_{11}H_{19}O_2$," should read --$Pb(C_{11}H_{19}O_2)_2$,--;
Line 32, "need" should read --needs--; and
Line 38, "following" should read --following,--.

COLUMN 10:

Line 16, "g as" should read --gas--.

COLUMN 11:

Line 6, "numeral 10" should read --and numeral 10--;
Line 32, "$LaSrCoO_3$" should read --$LaSrCoO_3$.--; and
Line 35, "one" should read --ones--.

COLUMN 12:

Line 23, "formed" should read --formed on--.

COLUMN 13:

Line 65, "$(1.00)SrTiO_3$" should read --$(100) SrTiO_3$--.

COLUMN 14:

Line 63, "piezorestictivity-" should read --piezorestrictivity- --.

COLUMN 15:

Line 4, "piezorestictivity." should read --piezorestrictivity.--;
Line 10, "piezorestictivity." should read --piezorestrictivity.--;
Line 15, "y—" should read --y=--; and
Line 49, "piezorestictivity" should read --piezorestrictivity--.

COLUMN 16:

Line 39, "$0 \leq x \leq 1, 0.43 \leq y \leq 0.65$" should read --$0 \leq x < 1, 0.43 \leq y \leq 0.65$--.

UNITED STATES PATENT AND TRADEMARK OFFICE
CERTIFICATE OF CORRECTION

PATENT NO. : 7,042,141 B2
APPLICATION NO. : 10/777120
DATED : May 9, 2006
INVENTOR(S) : Hiroshi Funakubo et al.

It is certified that error appears in the above-identified patent and that said Letters Patent is hereby corrected as shown below:

<u>COLUMN 17:</u>

Line 20 "{111}" should read --{100}--;
Line 29, "claim 1," should read --claim 17,--;
Line 33, "cubic and" should read --cubic or--;
Line 35, "cubic and" should read --cubic or--; and
Line 38, "the surface" should read --a surface--.

<u>COLUMN 18:</u>

Line 5, "or in which" should read --and in which--;
Line 6, "cubic and" should read --cubic or--;
Line 32, "wherein" should read --wherein the film is--;
Line 33, "crystal" should read --crystal thin--; and
Line 38, "is or" should read --or--.

Signed and Sealed this

Fifth Day of December, 2006

JON W. DUDAS
*Director of the United States Patent and Trademark Office*